US010903227B2

(12) United States Patent
Shim et al.

(10) Patent No.: US 10,903,227 B2
(45) Date of Patent: Jan. 26, 2021

(54) SEMICONDUCTOR DEVICES AND METHODS OF FABRICATING THE SAME

(71) Applicant: SAMSUNG ELECTRONICS CO., LTD., Suwon-si (KR)

(72) Inventors: Sunil Shim, Seoul (KR); Wonseok Cho, Suwon-si (KR); Woonkyung Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 511 days.

(21) Appl. No.: 15/609,578

(22) Filed: May 31, 2017

(65) Prior Publication Data

US 2017/0263643 A1 Sep. 14, 2017

Related U.S. Application Data

(60) Continuation of application No. 14/563,432, filed on Dec. 8, 2014, now Pat. No. 9,698,155, which is a
(Continued)

(30) Foreign Application Priority Data

Jul. 11, 2012 (KR) ........................ 10-2012-0075595

(51) Int. Cl.
| | | |
|---|---|---|
| *H01L 27/11582* | (2017.01) | |
| *H01L 29/78* | (2006.01) | |
| *H01L 23/538* | (2006.01) | |
| *H01L 27/24* | (2006.01) | |
| *H01L 27/11565* | (2017.01) | |

(Continued)

(52) U.S. Cl.
CPC .... *H01L 27/11582* (2013.01); *H01L 23/5384* (2013.01); *H01L 27/11556* (2013.01); *H01L 27/11565* (2013.01); *H01L 27/2409* (2013.01); *H01L 27/249* (2013.01); *H01L 27/2481* (2013.01); *H01L 29/7827* (2013.01); *H01L 45/04* (2013.01); *H01L 45/06* (2013.01); *H01L 45/1226* (2013.01); *H01L 45/144* (2013.01); *H01L 45/146* (2013.01);
(Continued)

(58) Field of Classification Search
None
See application file for complete search history.

(56) References Cited

U.S. PATENT DOCUMENTS

| | | |
|---|---|---|
| 7,679,133 B2 | 3/2010 | Son et al. |
| 8,084,809 B2 | 12/2011 | Maeda et al. |

(Continued)

FOREIGN PATENT DOCUMENTS

| | | |
|---|---|---|
| CN | 101794789 | 8/2010 |
| CN | 102104034 | 6/2011 |

(Continued)

*Primary Examiner* — Michelle Mandala
(74) *Attorney, Agent, or Firm* — F. Chau & Associates, LLC

(57) ABSTRACT

A semiconductor device includes a plurality of first insulating layers and a plurality of second layers alternately and vertically stacked on a substrate. Each of the plurality of second layers includes a horizontal electrode horizontally separated by a second insulating layer. A contact plug penetrates the plurality of first insulating layers and the second insulating layer of the plurality of second layers.

20 Claims, 51 Drawing Sheets

Related U.S. Application Data division of application No. 13/938,833, filed on Jul. 10, 2013, now Pat. No. 8,946,665.

(51) Int. Cl.
    *H01L 27/11556*     (2017.01)
    *H01L 45/00*     (2006.01)

(52) U.S. Cl.
    CPC .......... *H01L 45/147* (2013.01); *H01L 45/148* (2013.01); *H01L 2924/0002* (2013.01)

(56) References Cited

U.S. PATENT DOCUMENTS

| | | |
|---|---|---|
| 8,178,917 B2 | 5/2012 | Tanaka et al. |
| 8,394,716 B2 | 3/2013 | Hwang et al. |
| 8,482,049 B2 | 7/2013 | Son et al. |
| 8,492,797 B2 | 7/2013 | Hwang et al. |
| 8,643,080 B2 | 2/2014 | Lee et al. |
| 8,664,633 B2 | 3/2014 | Park et al. |
| 8,742,466 B2 | 6/2014 | Shim et al. |
| 8,946,665 B2 * | 2/2015 | Shim ............. H01L 29/7827 257/1 |
| 9,048,138 B2 | 6/2015 | Moon et al. |
| 9,356,033 B2 | 5/2016 | Son et al. |
| 2008/0061352 A1 | 3/2008 | Lee et al. |
| 2008/0265235 A1 | 10/2008 | Kamigaichi et al. |
| 2009/0020744 A1 | 1/2009 | Mizukami et al. |
| 2009/0230462 A1 | 9/2009 | Tanaka et al. |
| 2009/0267135 A1 | 10/2009 | Tanaka et al. |
| 2009/0302363 A1 * | 12/2009 | Nagai ............ H01L 27/11509 257/295 |
| 2010/0034028 A1 | 2/2010 | Katsumata et al. |
| 2010/0090286 A1 | 4/2010 | Lee et al. |
| 2010/0133598 A1 | 6/2010 | Chae et al. |
| 2010/0133599 A1 | 6/2010 | Chae et al. |
| 2010/0193861 A1 | 8/2010 | Shim et al. |
| 2010/0258860 A1 | 10/2010 | Kim et al. |
| 2011/0013454 A1 | 1/2011 | Hishida et al. |
| 2011/0115010 A1 | 5/2011 | Shim et al. |
| 2011/0121403 A1 | 5/2011 | Lee et al. |
| 2011/0151667 A1 | 6/2011 | Hwang et al. |
| 2011/0180856 A1 | 7/2011 | Matsuda et al. |
| 2011/0215394 A1 | 9/2011 | Komori et al. |
| 2011/0216597 A1 | 9/2011 | Higashi et al. |
| 2011/0248327 A1 | 10/2011 | Son et al. |
| 2011/0286804 A1 | 11/2011 | Kim et al. |
| 2012/0068241 A1 | 3/2012 | Sakuma et al. |
| 2012/0068253 A1 | 3/2012 | Oota et al. |
| 2012/0070944 A1 | 3/2012 | Kim et al. |
| 2012/0156848 A1 | 6/2012 | Yang et al. |
| 2012/0168858 A1 * | 7/2012 | Hong .............. H01L 27/11582 257/330 |
| 2012/0248525 A1 | 10/2012 | Lee et al. |
| 2015/0093865 A1 | 4/2015 | Shim et al. |

FOREIGN PATENT DOCUMENTS

| | | |
|---|---|---|
| CN | 102122661 | 7/2011 |
| CN | 102194826 | 9/2011 |
| CN | 102468321 | 5/2012 |
| JP | 2007317874 | 12/2007 |
| JP | 2009-267243 | 11/2009 |
| JP | 2010-165794 | 7/2010 |
| JP | 2011-199131 | 10/2011 |
| JP | 2011-204856 | 10/2011 |
| KR | 1020090047614 | 5/2009 |
| KR | 10-2011-0070143 | 6/2011 |
| KR | 10-2011-0133926 | 12/2011 |
| KR | 10-2012-0029889 | 3/2012 |
| KR | 10-2012-0041009 | 4/2012 |
| KR | 10-2012-0092483 | 8/2012 |
| WO | 2012009140 | 1/2012 |

\* cited by examiner

SEMICONDUCTOR DEVICES AND METHODS OF FABRICATING THE SAME

CROSS-REFERENCE TO RELATED APPLICATION

This application is a continuation of U.S. application Ser. No. 14/563,432 filed on Dec. 8, 2014, which is a divisional of U.S. application Ser. No. 13/938,833 filed on Jul. 10, 2013, which claims priority under 35 U.S.C. § 119 to Korean Patent Application No. 10-2012-0075595, filed on Jul. 11, 2012, in the Korean Intellectual Property Office, the disclosure of which is incorporated by reference herein in its entirety.

TECHNICAL FILED

The present inventive concepts relates to a semiconductor device, more particularly, to a vertical-type semiconductor device and a method of manufacturing the same.

DISCLOSURE OF RELATED ART

To satisfy excellent performance and low cost, semiconductor devices have been highly integrated. A density of integration in memory devices is an important factor in determining the prices of products. In typical Two-Dimensional (2D) memory devices, a density of integration is mainly determined by the occupied area of memory cells, which is affected by the level of fine pattern forming technology. However, this fine pattern forming technology, performed by high-cost equipments, may limit a density of integration in 2D semiconductor memory devices.

To overcome these limitations, three-dimensional (3D) memory devices including memory cells three-dimensionally arranged have been proposed. For mass production of the 3D memory devices, however, a process technology which reduces manufacturing costs per bit relative to 2D memory devices and secures reliable product characteristics is required.

SUMMARY

According to an exemplary embodiment of the present inventive concept, a semiconductor device includes a plurality of horizontal electrodes vertically stacked on a substrate. A plurality of first insulating layers each is disposed between a corresponding pair of the plurality of horizontal electrodes. A plurality of second insulating layers each is disposed between a corresponding pair of the plurality of first insulating layers and is disposed at the same vertical level as a corresponding one of the plurality of horizontal electrodes. A contact structure penetrates the first and second insulating layers. The contact structure is in contact with the first insulating layers and the second insulating layers.

According to an exemplary embodiment of the present inventive concept, a semiconductor device includes a stack structure disposed on a substrate. The stack structure includes four or more first insulating layers and four or more second insulating layers sequentially stacked one over the other. A contact structure penetrates the stack structure. Four or more horizontal electrodes are extended between the first insulating layers. The first insulating layers and the second insulating layers are in contact with the contact structure. The first insulating layers include different materials from the second insulating layers.

According to an exemplary embodiment of the present inventive concept, a plurality of first insulating layers and a plurality of second insulating layers are alternately stacked on a substrate. Spaces are formed between the plurality of second insulating layers by partially etching the plurality of second insulating layers. The spaces are defined by the plurality of first insulating layers and remaining portions of the plurality of second insulating layers. Horizontal electrodes are disposed in the spaces. A contact structure penetrates the plurality of first insulating layers and the remaining portions of the plurality of second insulating layers.

According to an exemplary embodiment of the inventive concept, a semiconductor device includes a plurality of first insulating layers and a plurality of second layers alternately and vertically stacked on a substrate. Each of the plurality of second layers includes a horizontal electrode horizontally separated by a second insulating layer. A contact plug penetrates the plurality of first insulating layers and the second insulating layer of the plurality of second layers.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION

Figure 1:
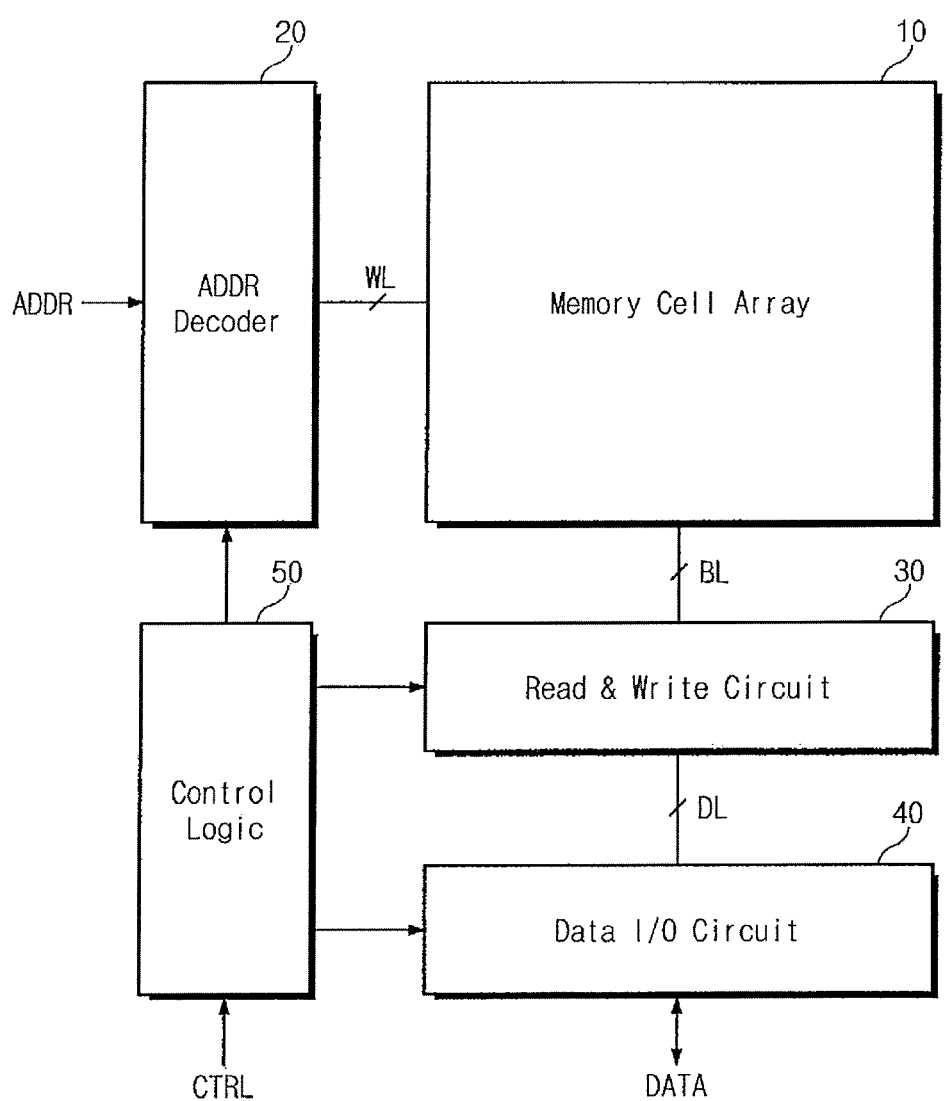
FIG. 1 is a block diagram illustrating a semiconductor device according to an exemplary embodiment of the inventive concept.

Exemplary embodiments of the inventive concepts will be described below in more detail with reference to the accompanying drawings. The inventive concepts may, however, be embodied in different forms and should not be construed as limited to the embodiments set forth herein; rather, these exemplary embodiments are provided so that this disclosure will be thorough and complete, and will fully convey the concept of example embodiments to those of ordinary skill in the art. In the drawings, the thicknesses of layers and regions are exaggerated for clarity. Like reference numerals denote like elements throughout the specification and drawings, and thus their description will be omitted.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating a semiconductor device according to an exemplary embodiment of the inventive concept. Referring to FIG. 1, a nonvolatile memory device according to an exemplary embodiment of the inventive concept includes a memory cell array 10, an address decoder 20, a read/write circuit 30, a data input/output circuit 40, and a control logic 50.

The memory cell array 10 is connected to the address decoder 20 through a plurality of word lines WL, and be connected to the read/write circuit 30 through a plurality of bit lines BL. The memory cell array 10 includes a plurality of memory cells (not shown). The memory cell array 10 may store one or more bits in each cell.

The address decoder 20 is connected to the memory cell array 10 through the word lines WL. The address decoder 20 operates according to the control of the control logic 50. The address decoder 20 may receive an address ADDR from the outside. The address decoder 20 decodes a row address among the received address ADDR to select a corresponding word line from among the word lines WL. Also, the address decoder 20 decodes a column address among the address ADDR and transfers the decoded column address to the read/write circuit 30. For example, the address decoder 20 may include elements such as a row decoder, a column decoder and an address buffer.

The read/write circuit 30 is connected to the memory cell array 10 through the bit line BL. The read/write circuit 30 may be connected to the data input/output circuit 40 through the data lines DL. The read/write circuit 30 may operate according to the control of the control logic 50. In response to the control, the read/write circuit 30 receives the decoded column address from the address decoder 20, and selects a bit line BL using the decoded column address. For example, the read/write circuit 30 receives data from the data input/output circuit 40 and writes the received data in the memory cell array 10. The read/write circuit 30 reads data from the memory cell array 10 and transfers the read data to the data input/output circuit 40. The read/write circuit 30 reads data from a first storage region (not shown) of the memory cell array 10, and writes the read data in a second storage region (not shown) of the memory cell array 10. For example, the read/write circuit 30 may perform a copy-back operation.

The read/write circuit 30 may include elements which include a page buffer (not shown) or a page register (not shown) and a column selection circuit (not shown). As another example, the read/write circuit 30 may include elements which include a sensing amplifier, a write driver and a column selection circuit.

The data input/output circuit 40 is connected to the read/write circuit 30 through the data lines DL. The data input/output circuit 40 operates according to the control of the control logic 50. The data input/output circuit 40 exchanges data DATA with the outside. For example, the data input/output circuit 40 transfers the data DATA to the read/write circuit 30 through the data lines DL. The data input/output circuit 40 outputs the data DATA, which is transferred from the read/write circuit 30 through the data lines DL, to the outside. For example, the data input/output circuit 40 may include a data buffer (not shown).

The control logic 50 is connected to the address decoder 20, the read/write circuit 30 and the data input/output circuit 40. The control logic 50 controls the operation of a 3D semiconductor device. The control logic 50 operates in response to a control signal CTRL transferred from the outside.

Figure 2:
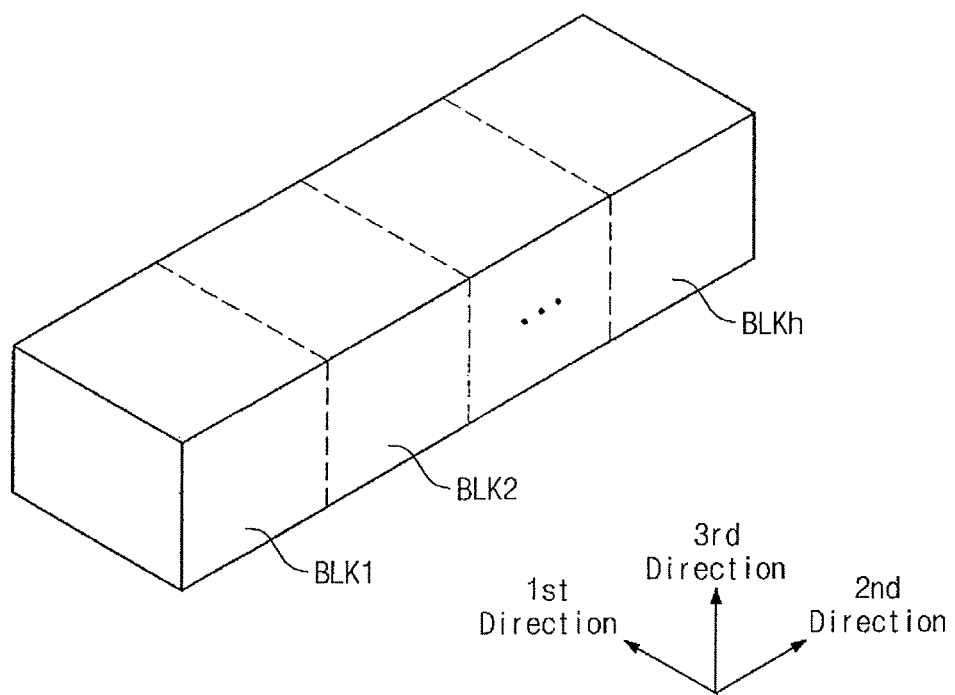
FIG. 2 is a block diagram schematically illustrating a memory cell array of FIG. 1.

FIG. 2 is a block diagram illustrating as an example of the memory cell array 10 of FIG. 1. Referring to FIG. 2, the memory cell array 10 may include a plurality of memory blocks BLK1 to BLKh. Each of the memory blocks BLK1 to BLKh may have a vertical 3D structure. For example, the each of the memory blocks BLK1 to BLKh may include structures that are extended in first to third directions intersecting each other. For example, the each of the memory blocks BLK1 to BLKh includes a plurality of cell strings (not shown) that are extended in the third direction.

Figure 3:
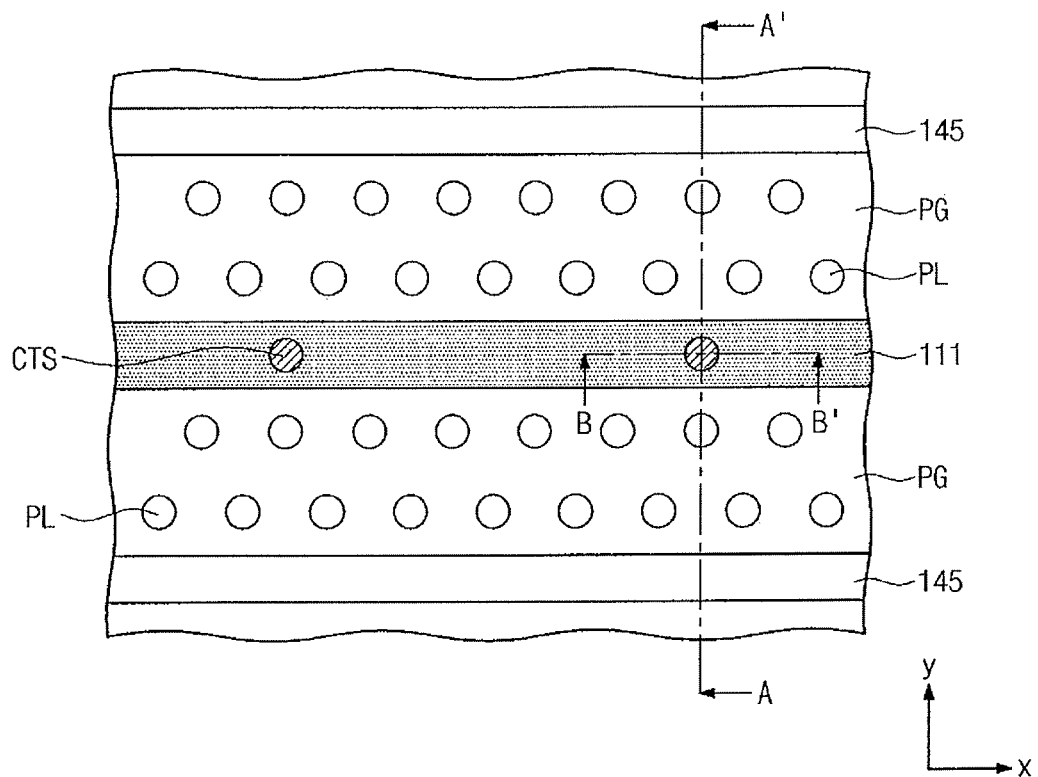
FIG. 3 is a plan view illustrating a semiconductor device and a method of fabricating the same, according to an exemplary embodiment of the inventive concept.

A semiconductor device and a method of fabricating the same, according to an exemplary embodiment of the inventive concept, will be described with reference to FIGS. 3 through 11. FIG. 3 is a plan view illustrating a semiconductor device according to an exemplary embodiment of the inventive concept. FIGS. 4 through 11 are sectional views taken along lines A-A' and B-B' of FIG. 3.

Figure 4:
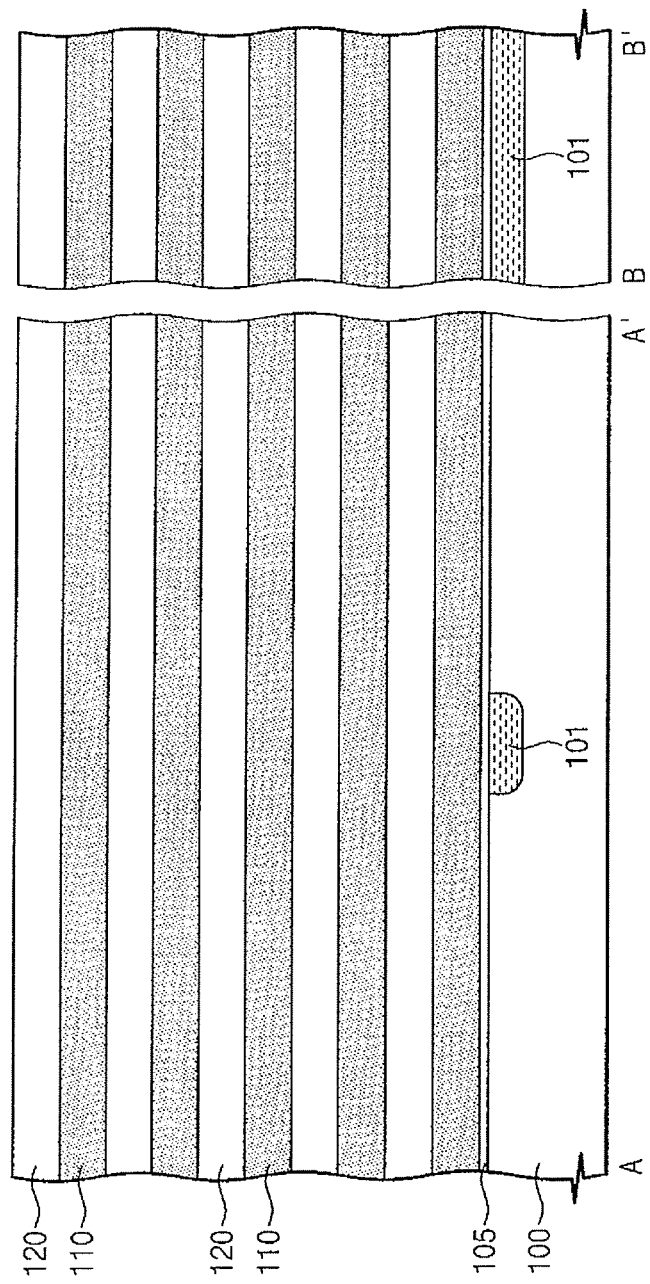
FIGS. 4 through 11 are sectional views taken along lines A-A' and B-B' of FIG. 3.

Referring to FIGS. 3 and 4, a substrate 100 is provided. The substrate 100 may include a silicon substrate, a germanium substrate, or a silicon-germanium substrate. The substrate 100 may include a doped region having a first conductivity type. For example, the first conductivity type may be a p-type. A first conductive region 101 is provided in the substrate 100. The first conductive region 101 may be configured to apply a specific voltage to the substrate 100. The first conductive region 101 may be a doped region provided in an upper region of the substrate 100. For example, the first conductive region 101 may have the same conductivity type as the substrate 100 and have a doping concentration higher than the substrate 100. For example, the first conductive region 101 may have a line shape extending along an x direction. The first conductive region 101 may be formed by an ion implantation process.

A buffer insulating layer 105 is formed on the substrate 100. The buffer insulating layer 105 may include a silicon oxide layer. The buffer insulating layer 105 may be formed using a thermal oxidation process. Second insulating layers 110 and first insulating layers 120 are alternately stacked on the buffer insulating layer 105. According to an exemplary embodiment, the numbers of the first insulating layers 120 and the second insulating layers 110 may be four or more. For example, a pair of the first and second insulating layers 120 and 110 may be repeatedly formed ten or more times. The second insulating layers 110 and the first insulating layers 120 may include materials having etch selectivity with respect to each other. For example, when a specific etch recipe is used to etch the second insulating layers 110, the first insulating layers 120 may include materials having a much lower etch rate than that of the second insulating layers 110 to the specific etch recipe. The etch selectivity may be quantitatively expressed in terms of a ratio of an etch rate of the second insulating layers 110 to that of the first insulating layers 120. For example, the second insulating layers 110 may include materials having etch selectivity of 1:10 to 1:200 (or 1:30 to 1:100) with respect to the first insulating layers 120. For example, the second insulating layers 110 may include a silicon nitride layer, a silicon oxynitride layer, and/or a polysilicon layer. The first insulating layers 120 may include a silicon oxide layer. The insulating layers 110 and 120 may be formed by a chemical vapor deposition (CVD).

Figure 5:
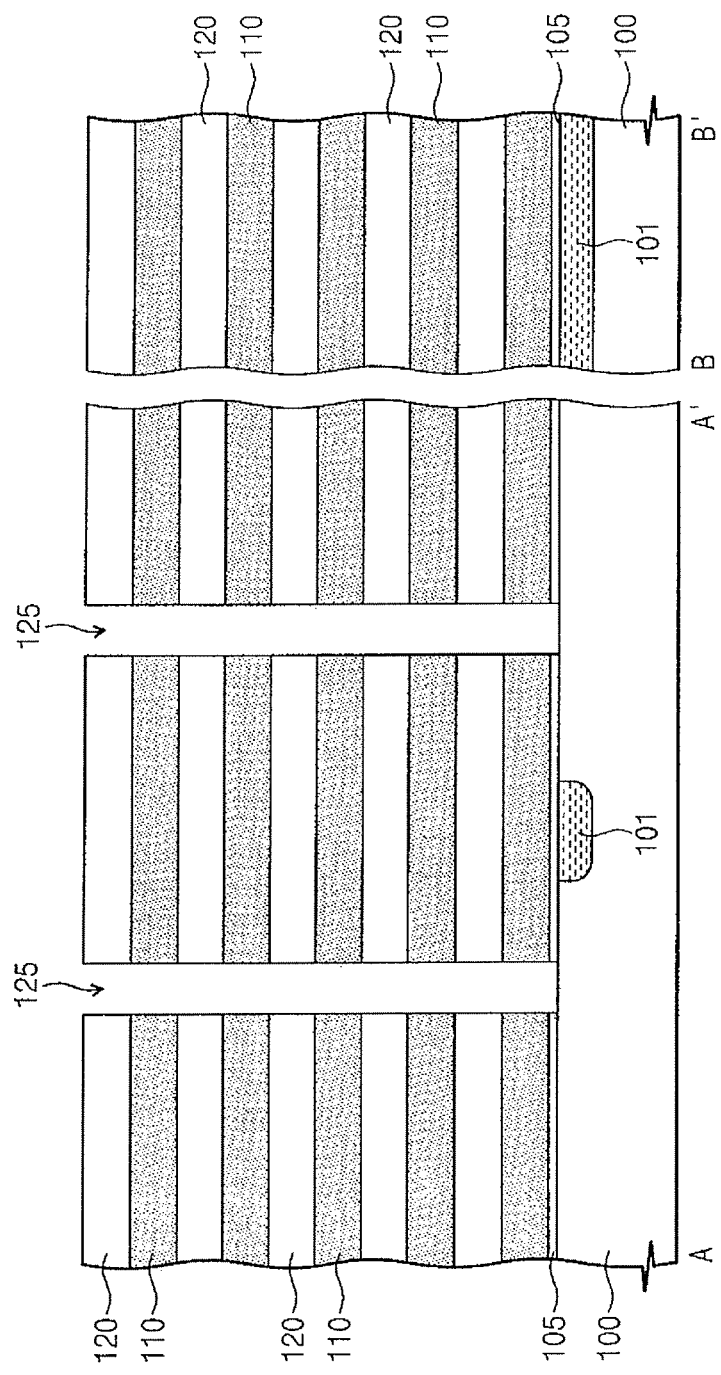

Referring to FIGS. 3 and 5, cell holes 125 are formed through the insulating layers 110 and 120 to expose the substrate 100 using an anisotropic etching process.

Figure 6:
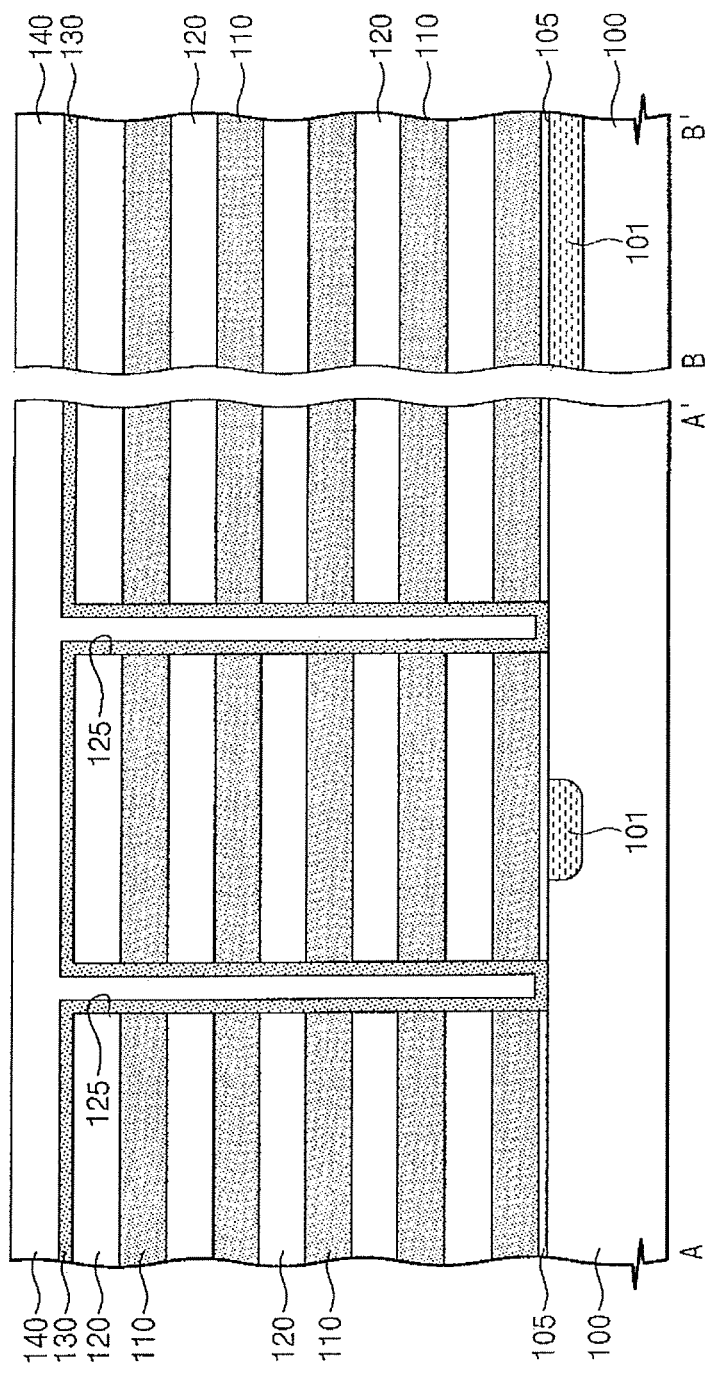

Referring to FIGS. 3 and 6, a semiconductor layer 130 and a gap-fill insulating layer 140 are sequentially formed to fill each of the cell holes 125. The semiconductor layer 130 may be conformally formed in such a manner that the cell holes 125 are not completely filled with the semiconductor layer 130. For example, the semiconductor layer 130 may be formed to conformally cover sidewalls of the insulating layers 110 and 120 and a top surface of the substrate 100. The sidewalls of the insulating layers 110 and 120 and the top surface of the substrate 100 define the cell holes 125. The gap-fill insulating layer 140 may be formed to fill the cell holes 125 provided with the semiconductor layer 130. The semiconductor layer 130 and the gap-fill insulating layer 140 may cover a top surface of an uppermost one of the first insulating layers 120. Alternatively, the semiconductor layer 130 may fill the cell holes 125. In such a case, the gap-fill insulating layer 140 need not be provided.

For example, the semiconductor layer 130 may include a polysilicon layer having the first conductivity type. The gap-fill insulating layer 140 may include a silicon oxide layer or a silicon oxynitride layer. Alternatively, the semiconductor layer 130 may include a conductive layer (e.g., a doped semiconductor layer, a metal layer, a conductive metal nitride layer, a silicide layer), or a nano structure (e.g., a carbon nanotube or a graphene layer). According to an exemplary embodiment, the semiconductor layer 130 and the gap-fill insulating layer 140 may be formed using a chemical vapor deposition process or an atomic layer deposition (ALD) process.

Figure 7:
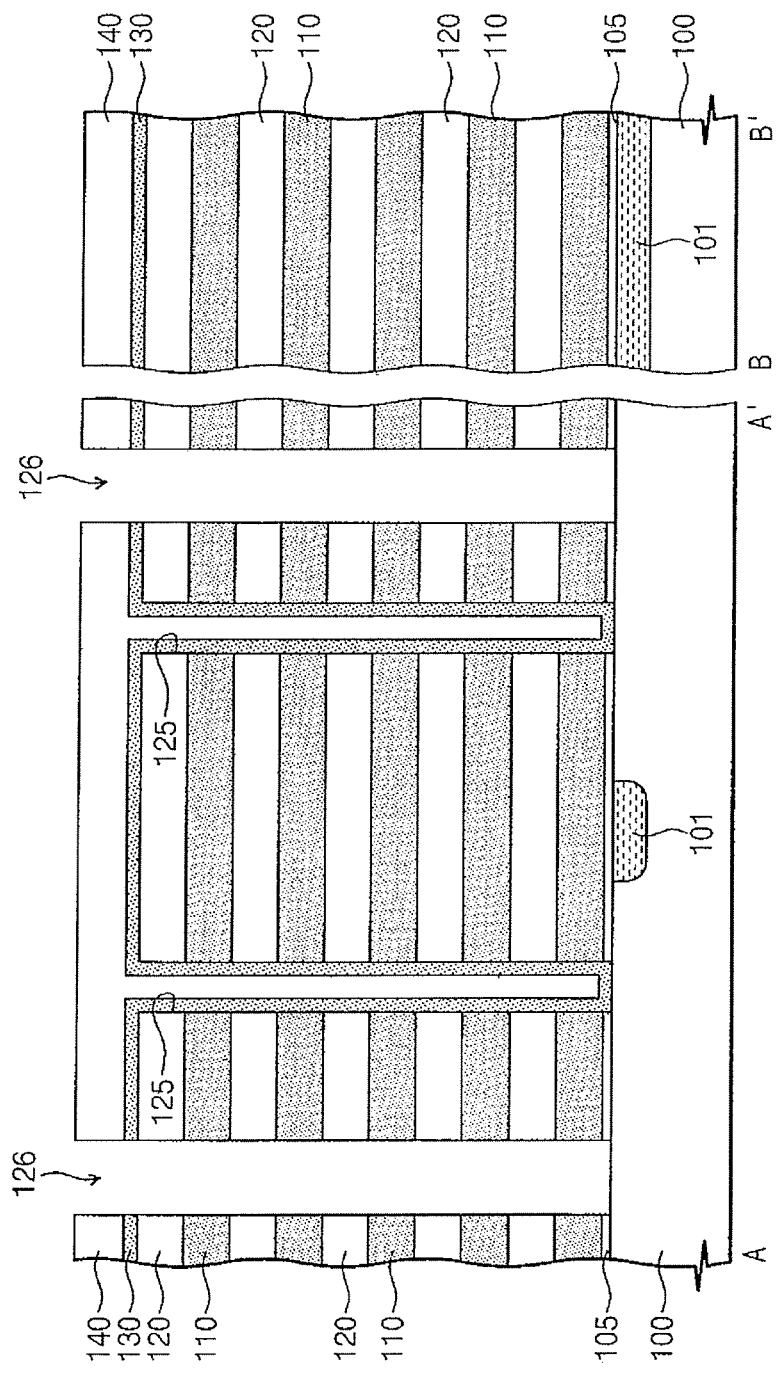

Referring to FIGS. 3 and 7, the semiconductor layer 130, separation regions 126 may be formed to expose the substrate 100 through the gap-fill insulating layer 140, and the insulating layers 110 and 120. The separation regions 126 may be delimited by sidewalls of the insulating layers 110 and 120 and the top surface of the substrate 100. For example, the separation regions 126 may be formed to have a trench-shaped structure extending along the x direction.

Figure 8:
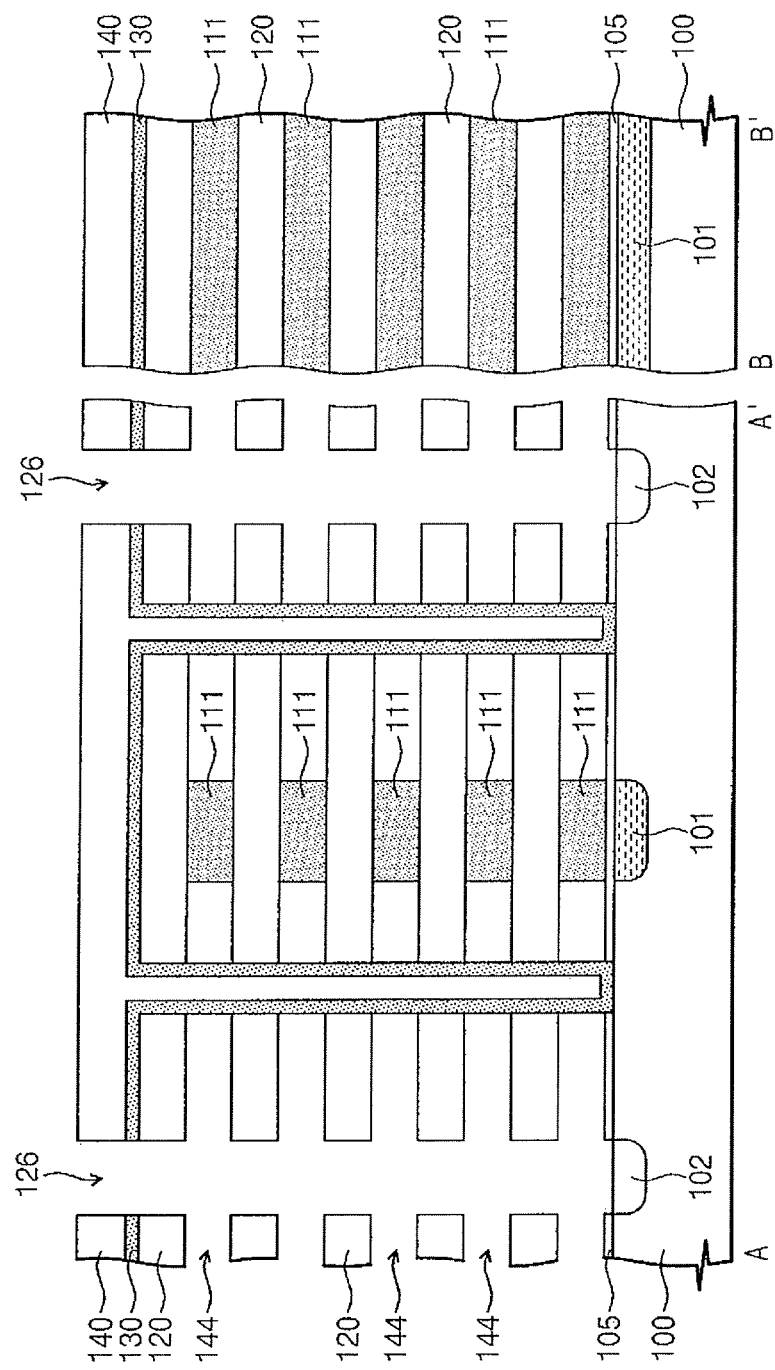

Referring to FIGS. 3 and 8, the second insulating layers 110 exposed by the separation regions 126 may be partially removed to form recess regions 144. For example, the recess regions 144 may be empty regions produced by removing the second insulating layers 110. In the case where the second insulating layers 110 include a silicon nitride layer or a silicon oxynitride layer, the formation of the recess regions 144 may be performed using an etching solution containing a phosphoric acid. Each of the recess regions 144 may be formed to partially expose a sidewall of the semiconductor layer 130. For example, portions of the second insulating layers 110 (hereinafter, referred as to residual insulating layers 111) may remain between the first insulating layers 120, even after the formation of the recess regions 144. The residual insulating layers 111 may be formed to be overlapped with the first conductive region 101, in plan view. The formation of the residual insulating layers 111 will be described in more detail with reference to FIGS. 16 through 21.

Figure 9:
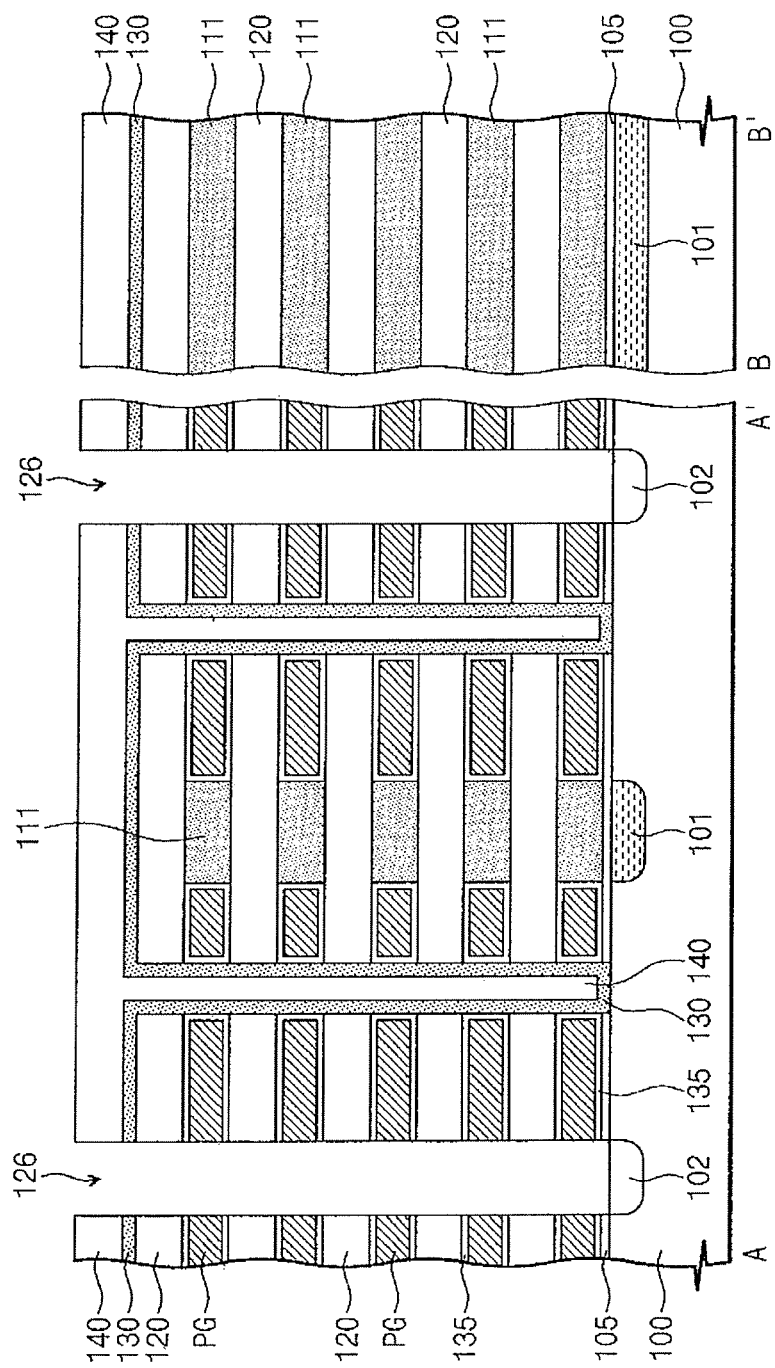

Referring to FIGS. 3 and 9, a memory element 135 and horizontal electrodes PG are formed in the recess regions 144. For example, a memory layer (not shown) and a conductive layer (not shown) may be sequentially formed in the recess regions 144 and in the separation region 126. The memory element 135 and horizontal electrodes PG may be formed by removing portions of the memory layer and the conductive layer located in the separation region 126 or at the outside of the recess regions 144. For example, the memory element 135 may include a tunnel insulating layer (not shown), a charge storing layer (not shown) on the tunnel insulating layer, and a blocking insulating layer (not shown) on the charge storing layer. Alternatively, the memory element 135 may be a variable resistance pattern. The horizontal electrodes PG are vertically spaced apart from each other by the first insulating layers 120. The horizontal electrodes PG may include a doped silicon layer, a metal layer, a metal silicide layer, and/or a conductive metal nitride layer. The memory element 135 and the horizontal electrodes PG will be described in more detail with reference to FIGS. 30A through 30D and FIGS. 31A through 31D.

Impurity regions 102 are formed in an upper portion of the substrate 100 exposed by the separation regions 126. The impurity regions 102 may include a different conductivity type (e.g., a second conductivity type or n-type) from and having a higher concentration than the substrate 100. The impurity regions 102 may be of a line shape extending along the x direction. The impurity regions 102 may serve as common source lines of the semiconductor device.

Figure 10:
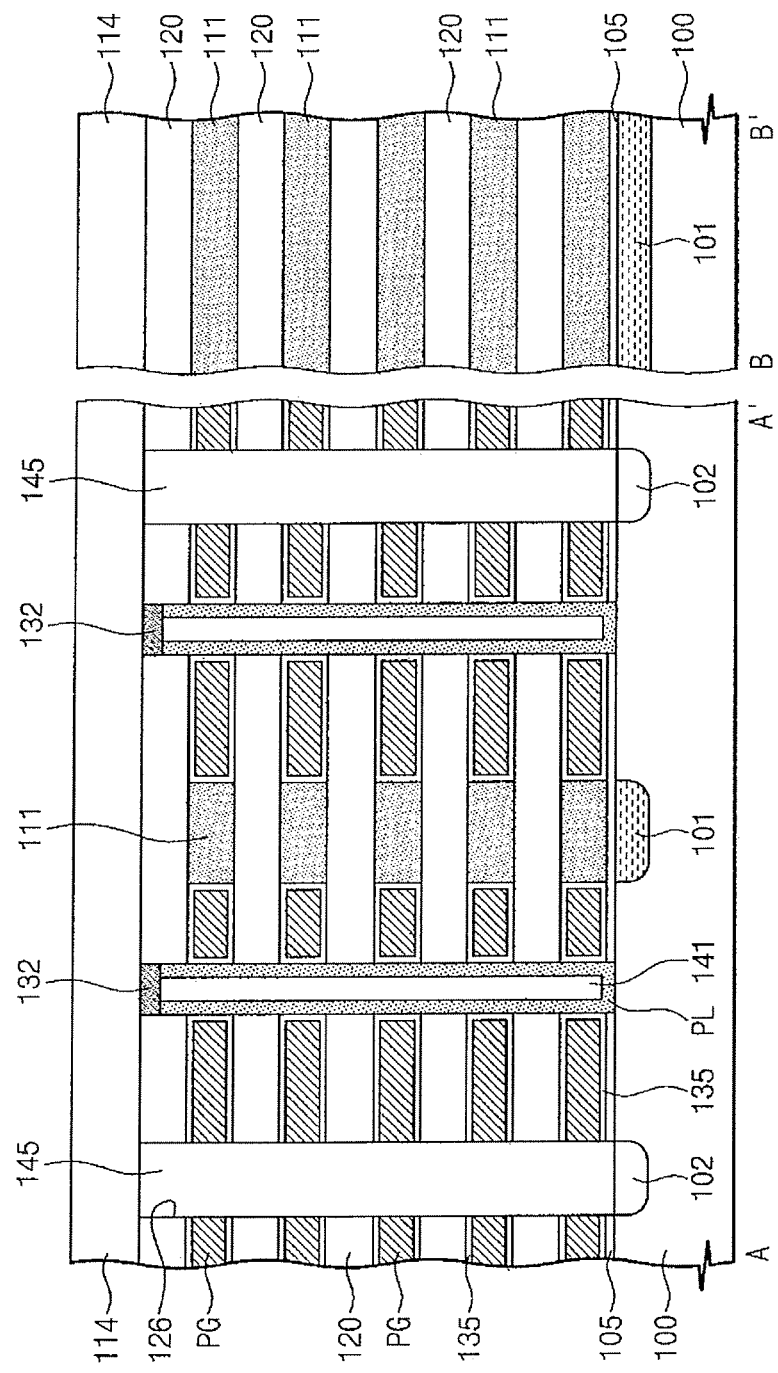

Referring to FIGS. 3 and 10, separation layers 145 are formed to fill the separation regions 126. For example, an insulating layer (not shown) may be formed in the separation regions 126 and may be formed on an upper surface of the gap-fill insulating layer 140 of FIG. 9. For example, the insulating layer may include a silicon oxide layer and/or a silicon oxynitride layer. A planarization process may be performed to remove the insulating layer (now shown), the gap-fill insulating layer 140 of FIG. 9 and the semiconductor layer 130 of FIG. 9. In such a case, the separation layers 145 are left in the separation regions 126 and the gap-fill insulating layer 140 of FIG. 9 is left in the cell holes 125 to form the separation layers 145 and gap-fill insulating patterns 141, respectively. The gap-fill insulating layer 140 of FIG. 9 is localized in each of the cell holes 125 to form the gap-fill insulating patterns 141.

Second conductive regions 132 are formed on the cell pillars PL. For example, upper portions of the cell pillars PL may be removed, and a doped polysilicon layer or a metal layer may be deposited. For example, the second conductive regions 132 may include a doped pattern of an n-type semiconductor. The second conductive regions 132 may serve as drain regions of the semiconductor device. A first interlayered insulating layer 114 is formed to cover the second conductive regions 132 using a chemical vapor deposition. The first interlayered insulating layer 114 may include a silicon oxide layer and/or a silicon oxynitride layer.

Figure 11:
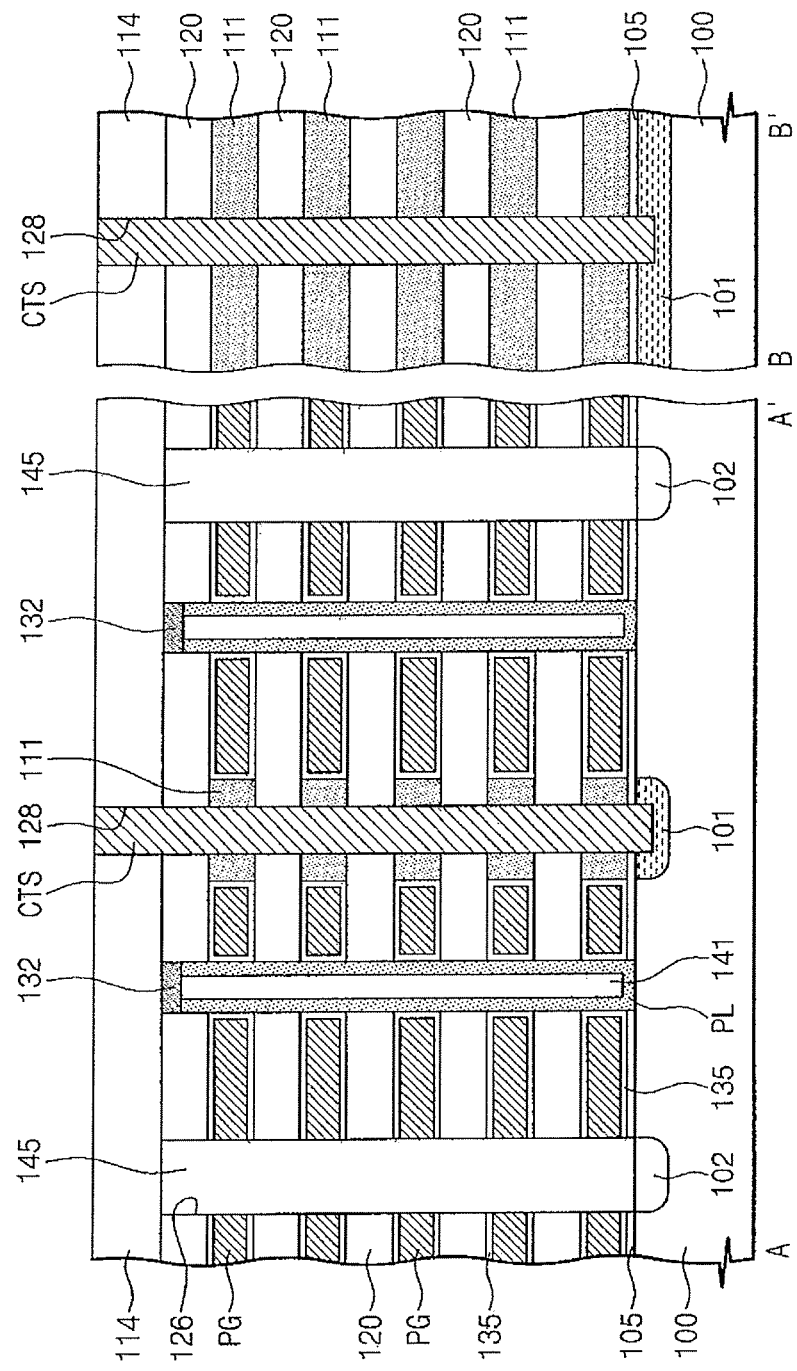

Referring to FIGS. 3 and 11, a contact plug CTS is formed through the residual insulating layers 111. The contact plug CTS is electrically connected to the first conductive region 101 through the first interlayered insulating layer 114, the first insulating layers 120, and the residual insulating layers 111. In an exemplary embodiment, when a semiconductor device may include contact plugs CTS, the contact plugs CTS may be arranged along a direction in which the residual insulating layers 111 are extended. For example, the contact plugs CTS may be arranged in the x direction. The contact plug CTS is formed in contact hole 128 and is in contact with the first conductive region 101 exposed by the contact hole 128. The contact hole 128 may be formed by using an anisotropic etching process. The contact plug CTS may include a metal layer, a conductive metal nitride layer, a metal silicide layer, and/or a doped semiconductor layer. In the case where the contact plug CTS includes metal, a metal silicide layer may be formed between the contact plug CTS and the first conductive region 101.

A semiconductor device according to an exemplary embodiment of the inventive concept will be described with reference to FIGS. 3 and 11. The semiconductor includes the horizontal electrodes PG, the cell pillars PL, and contact plugs CTS. The horizontal electrodes PG are sequentially stacked on the substrate 100. The horizontal electrodes PG are horizontally separated from each other by the separation layers 145 and extend along the x direction. The impurity regions 102 are provided in the substrate 100 below the separation layers 145. The impurity regions 102 may include doped regions having a different conductivity type from the substrate 100. The impurity regions 102 may serve as the common source lines of the semiconductor device.

The cell pillars PL are connected to the substrate 100 through the horizontal electrodes PG. In an exemplary embodiment, the cell pillars PL include a first row of cell pillars adjacent to the separation layers 145 and a second row of cell pillars adjacent to the residual insulating layers 111. The memory elements 135 are provided between the cell pillars PL and the horizontal electrodes PG. For example, each of the memory elements 135 may include the tunnel insulating layer, the charge storing layer on the tunnel insulating layer, and the blocking insulating layer on the charge storing layer. Alternatively, each of the memory elements 135 may include a variable resistance pattern.

The horizontal electrodes PG are vertically separated from each other by the first insulating layers 120. The residual insulating layers 111 are provided between the first insulating layers 120. The residual insulating layers 111 are located at the same level as the corresponding one of the horizontal electrodes PG. For example, the horizontal electrodes PG partially fill interlayer regions between the first insulating layers, and the residual insulating layers 111 fill the remaining portions of the interlayer regions. Top and bottom surfaces of the residual insulating layers 111 are in contact with the first insulating layers 120. Each of the residual insulating layers 111 is extended along a direction in which the separation layers 145 are extended. For example, the separation layers 145 may be extended along the x direction. The horizontal electrodes PG may include portions interposed between the cell pillars PL and the residual insulating layers 111. The residual insulating layers 111 may include a material having etch selectivity with respect to the first insulating layers 120. For example, in the case where the first insulating layers 120 include a silicon oxide layer, the residual insulating layers 111 may include a silicon nitride layer, a silicon oxynitride layer, and/or a polysilicon layer.

The contact plug CTS is connected to the first conductive region 101 of the substrate 100 penetrating the first insulating layers 120 and the residual insulating layers 111. The contact plug CTS is in contact with the first insulating layers 120 and the residual insulating layers 111. For example, the first conductive region 101 may include a doped region having the same conductivity type as and having a higher concentration than the substrate 100. The contact plug CTS is electrically separated from the horizontal electrodes PG by the first insulating layers 120 and the residual insulating layers 111. In an exemplary embodiment, when the semiconductor device includes contact plugs CTS, the contact plugs CTS may be arranged along a direction in which the residual insulating layers 111 are extended. For example, the residual insulating layers 111 are extended along the x direction. The contact plugs CTS may be spaced apart at a distance that may be greater than that between the cell pillars PL arranged along the x direction.

The number of memory elements 135 may be increased by stacking more layers on the substrate 100. In such a case, the residual insulating layers 111 surrounding the contact plug CTS may eliminate an additional insulation layer to isolate the contact plug CTS from the horizontal electrodes PG. The additional insulating layer may have a thickness that is necessary to prevent an electrical breakdown of the additional insulation layer, and thus this elimination increases integration density of the vertical-type semiconductor memory cells.

According to an exemplary embodiment of the inventive concept, portions of the second insulating layers 111 remain, and the contact plug CTS penetrates the remaining portions of the second insulating layers 111. This structure of the contact plug CTS enables to omit a process of forming the additional insulating layer to electrically separate the horizontal electrodes PG from the contact plug CTS. For example, a contact structure of the semiconductor device may be fabricated using a simplified process without a process step of forming the additional insulating layer. Furthermore, this omission of the additional insulating layer reduces a size of the contact hole 128 in which the contact plug CTS is provided, and thus, the semiconductor device increases integration density of memory cells.

Figure 12:
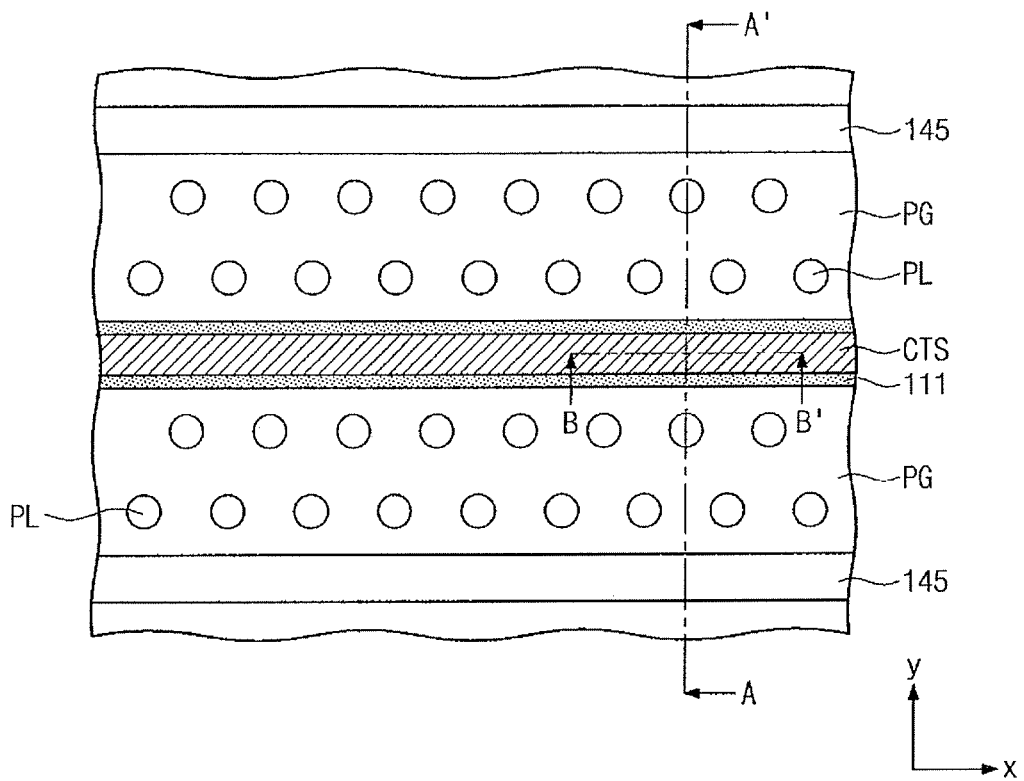
FIG. 12 is a plan view illustrating a semiconductor device and a method of fabricating the same, according to an exemplary embodiment of the inventive concept.
Figure 13:
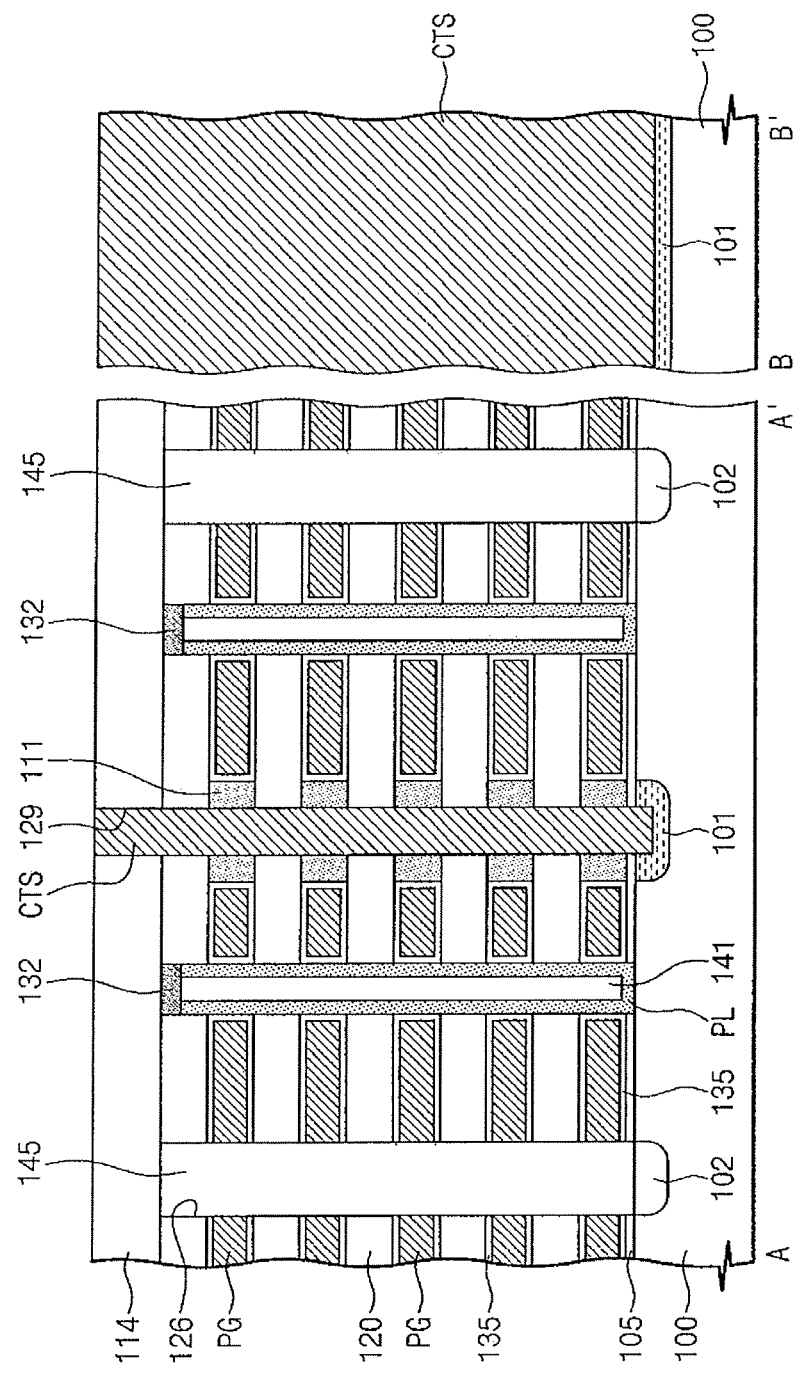
FIG. 13 is a sectional view taken along lines A-A' and B-B' of FIG. 12.

A semiconductor device according to an exemplary embodiment of the inventive concept will be described with reference to FIGS. 12 and 13. FIG. 12 is a plan view illustrating semiconductor devices and methods of fabricating the same, according to an exemplary embodiment of the inventive concept. FIG. 13 is a sectional view taken along lines A-A' and B-B' of FIG. 12. The exemplary embodiment of FIGS. 12 and 13 is substantially similar to that of FIGS. 3 to 11, except for a structure of a contact plug CTS. For the sake of brevity, the elements and features previously shown and described will not be described in much further detail.

A contact plug CTS of FIG. 12 according to an exemplary embodiment is extended along a direction in which the residual insulating layers 111 are extended. For example, the residual insulating layers 111 are extended along the x direction, and are formed in a trench 129 exposing a portion of the substrate 100. For example, the contact plug CTS includes a line-shaped horizontal section extending along the separation layers 145. The first conductive region 101 is extended along the extending direction of the contact plug CTS and is electrically connected to the contact CTS. For example, the trench 129 may be formed using an anisotropic etching process. The trench 129 may be delimited by sidewalls of the residual insulating layers 111, sidewalls of the first insulating layers 120, and the top surface of the substrate 100.

Figure 14:
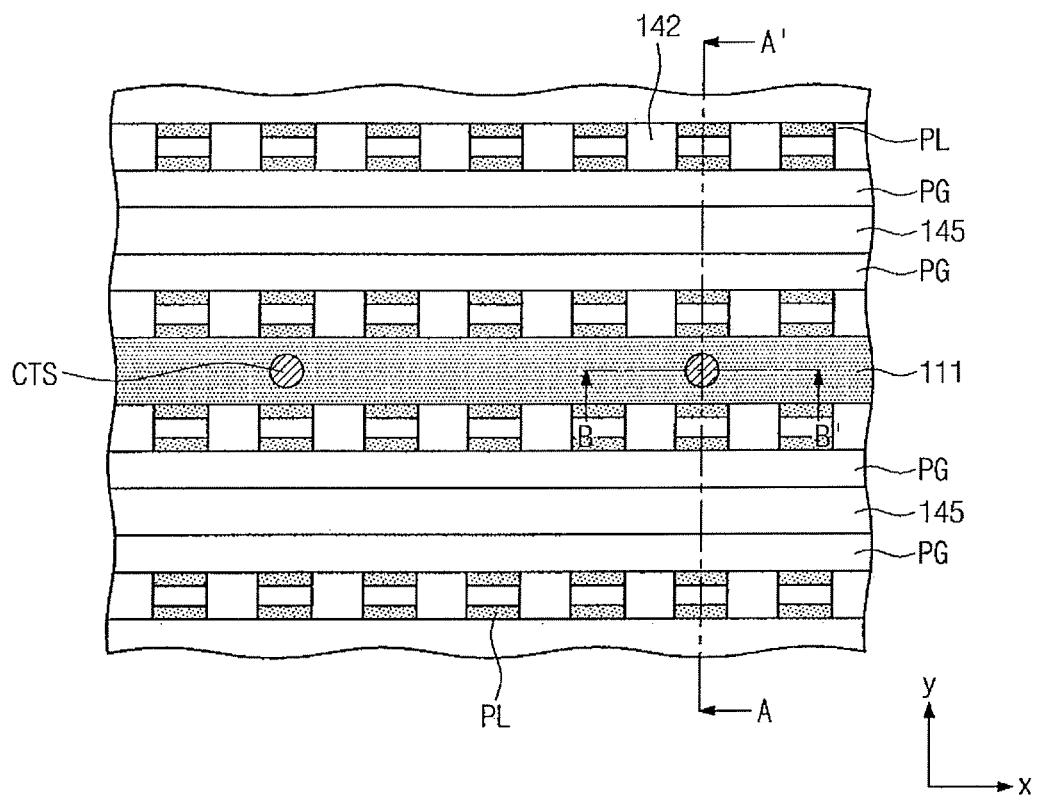
FIG. 14 is a plan view illustrating a semiconductor device and a method of fabricating the same, according to an exemplary embodiment of the inventive concept.
Figure 15:
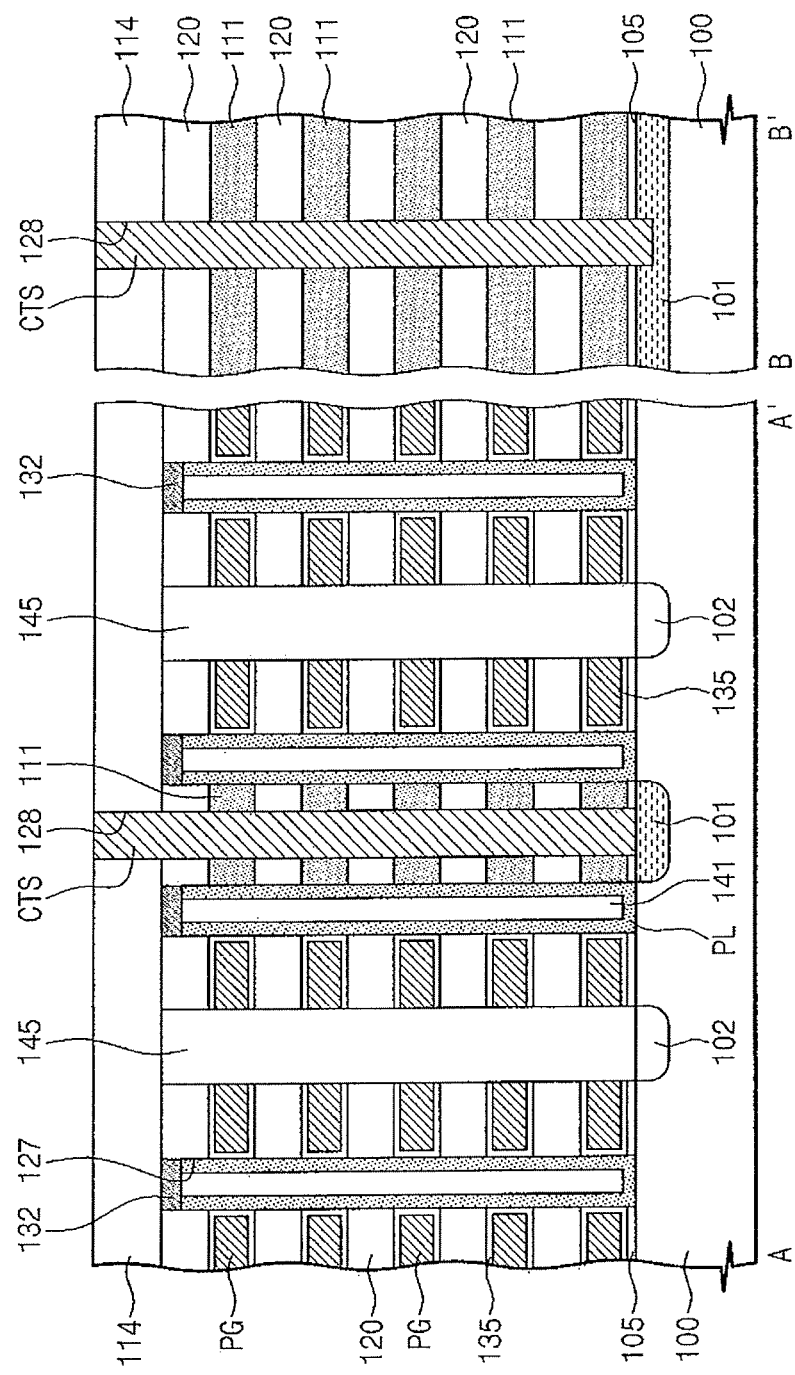
FIG. 15 is a sectional view taken along lines A-A' and B-B' of FIG. 14.

A semiconductor device according to an exemplary embodiment of the inventive concept will be described with reference to FIGS. 14 and 15. FIG. 14 is a plan view illustrating a semiconductor device and a method of fabricating the same, according to an exemplary embodiment of the inventive concept, and FIG. 15 is a sectional view taken along lines A-A' and B-B' of FIG. 14. This exemplary embodiment of FIGS. 14 and 15 is substantially similar to that of FIGS. 3 to 11, except for a shape of the cell pillars PL and a structural relationship between the cell pillars PL and the horizontal electrodes PG. For the sake of brevity, the elements and features of this example previously shown and described will not be described in much further detail.

The cell pillars PL of FIG. 14 are separated from each other by second gap-fill insulating patterns 142 arranged along the x direction. Each of the cell pillars PL has a 'U'-shaped structure filled with a first gap-fill insulating pattern 141. Each of the first gap-fill insulating patterns 141 has substantially the same width as the corresponding one of the cell pillars PL and is in contact with the second gap-fill insulating patterns 142. For example, trenches 127 may be formed, exposing the substrate 100. A semiconductor layer (not shown) and an insulating layer (not shown) may be formed in the trenches 127 (not shown). Thereafter, the semiconductor layer (not shown) and the insulating layer (not shown) may be divided along the x direction to form the cell pillars PL. The second gap-fill insulating patterns 142 are formed between the cell pillars PL. The second gap-fill insulating patterns 142 may include a silicon oxide layer and/or a silicon oxynitride layer.

According to an exemplary embodiment, the horizontal electrodes PG are separated from the residual insulating layers 111 with the cell pillars PL interposed therebetween. For example, the residual insulating layers 111 and the first insulating layers 120 provided along the sidewall of the contact plug CTS are separated from the horizontal electrodes PG by the cell pillars PL and the second gap-fill insulating patterns 142. The residual insulating layers 111 are in contact with the sidewalls of the cell pillars PL.

FIGS. 16 through 19 are plan views illustrating a process of forming the residual insulating layers 111 according to an exemplary embodiment of the inventive concept. For the sake of brevity, the elements and features of this example previously shown and described will not be described in much further detail.

Figure 16:
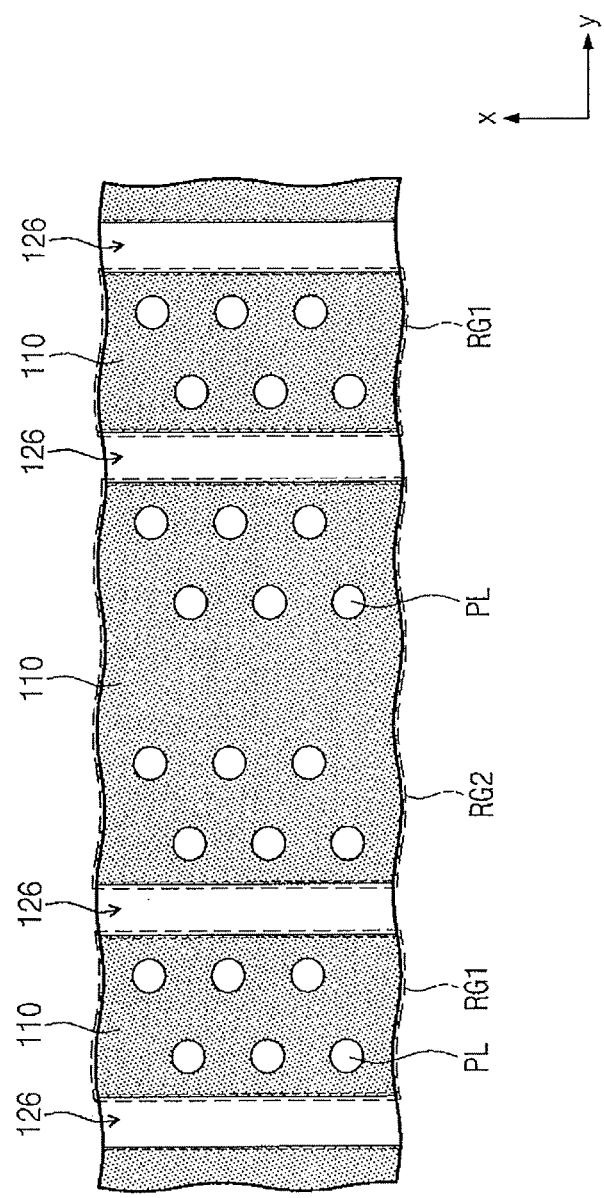
FIGS. 16 through 19 are plan views illustrating a process of forming residual insulating layers, according to some exemplary embodiments of the inventive concept.
Figure 17:
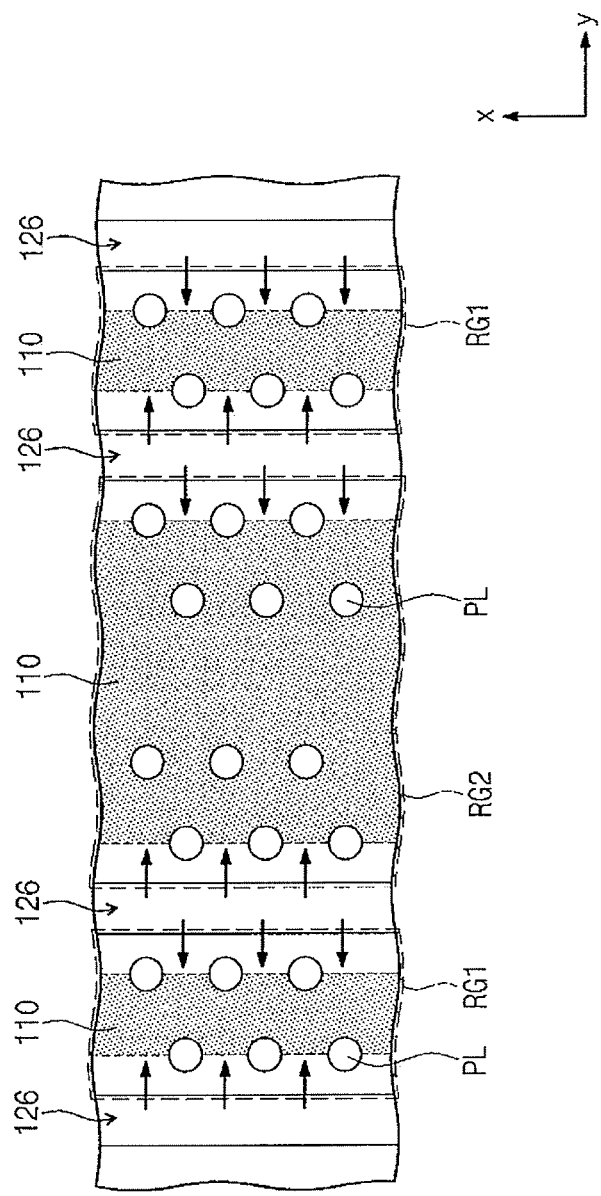

FIG. 16 shows an intermediate step of the process of forming the recess regions described with reference to FIGS. 7 and 8. The first insulating layers 120 include first sub-dielectric layers RG1 and second sub-dielectric layers RG2 separated by the separation regions 126. The first sub-dielectric layers RG1 may have smaller width than the second sub-dielectric layers RG2. The second insulating layers 110 may be removed using an etching solution selectively etching the second insulating layers 110 with respect to the first insulating layers 120. The etching solution may be supplied through the separation regions 126. As shown in FIG. 17, the etching solution may be flowed into spaces between the first insulating layers to etch the second insulating layers 110 in a horizontal direction. Arrows in FIG. 17 represent an inflow direction of the etching solution. The etching solution may isotropically etch the second insulating layers 110. For example, the second insulating layers 110 may be etched to have substantially the same lateral depth (for example, in the y direction) from the separation regions 126. Further, the cell pillars PL are partially exposed, as the result of the horizontal etching of the second insulating layers 110.

Figure 18:
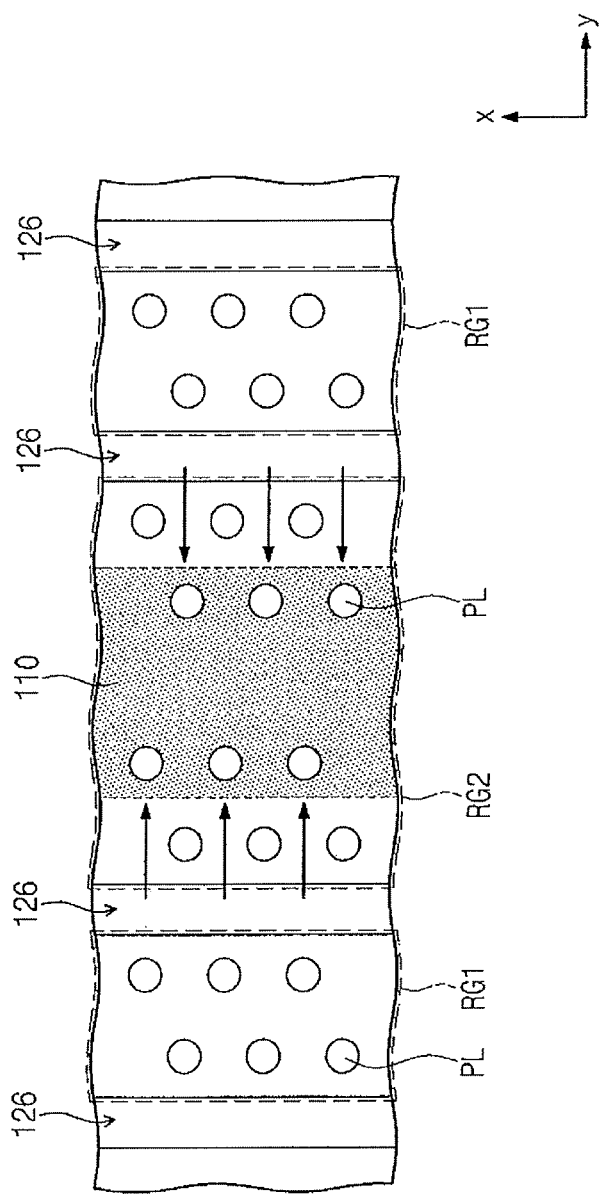
Figure 19:
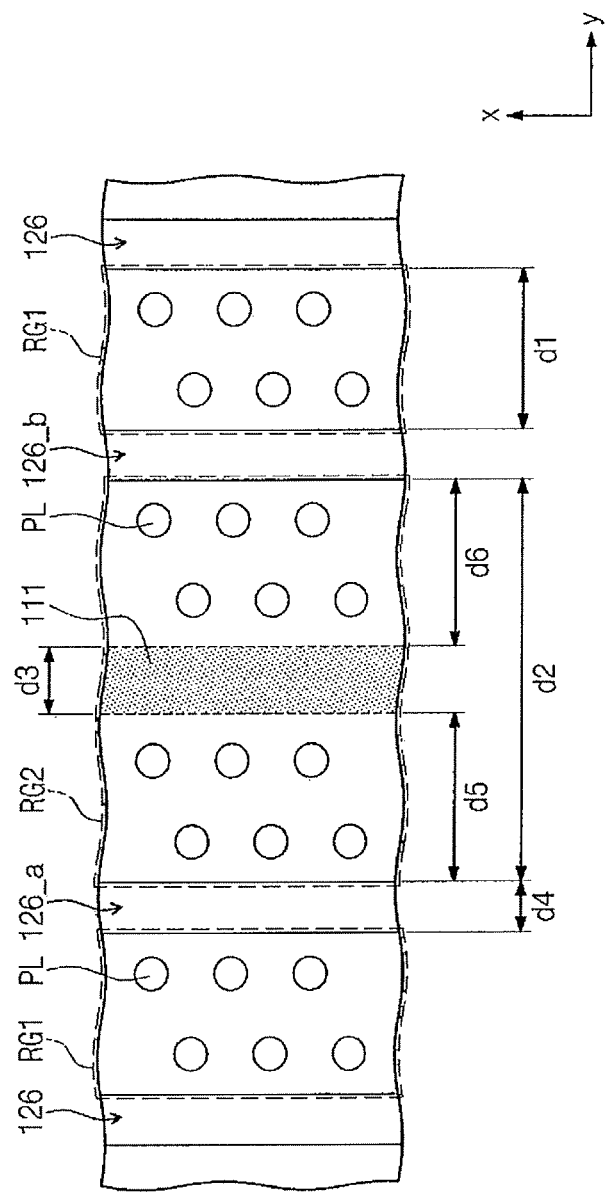

Referring to FIG. 18, in an intermediate stage of the horizontal etching process, the second insulating layers 110 are completely removed from regions between the first sub-dielectric layers RG1 having a width smaller than the second sub-dielectric layers RG2. By contrast, the second insulating layers 110 remain in regions between the second sub-dielectric layers RG2 having a width greater than the first sub-dielectric layer. In a final stage of the horizontal etching process, as shown in FIG. 19, the sidewall of all the cell pillars PL are completely exposed, and thus, the second insulating layers 110 are removed except the residual insulating layer 111. The residual insulating layers 111 are positioned within a localized region between two arrays of the cell pillars PL. For example, in the case where the first and second sub-dielectric layers RG2 have widths of d1 and d2, respectively, a width d3 of the residual insulating layer 111 is equal to a width of d2−2*d1. For example, the width d2 of the second sub-dielectric layers RG2 may be greater than twice the width d1 of the first sub-dielectric layers RG1.

As shown in FIG. 19, the residual insulating layer 111 is interposed between a first and a second separation regions 126_a and 126_b. For example, the first separation region 126_a is positioned between the RG1 and RG2 at the left to the residual insulating layer 111, and the second separation region 126_b is positioned between the RG1 and RG2 at the right to the residual insulating layer 111. The residual insulating layer 111 is interposed between the first and second separation regions 126_a and 126_b. If the second insulating layers are etched at the same lateral etch rate from the separation regions 126_a and 126_b, a distance d5 between the first separation region 126_a and the residual insulating layers 111 may be substantially the same with a distance d6 between the second separation region 126_b and the residual insulating layer 111. The width d3 of the residual insulating layers 111 may be greater than a width d4 of the separation regions 126.

Alternatively, the horizontal etching process may be stopped at the stage depicted in FIG. 18. In this case, the residual insulating layers 111 are penetrated by some of the cell pillars PL, and the subsequent processes described above with reference to FIGS. 9 to 11 are performed thereto.

Figure 20:
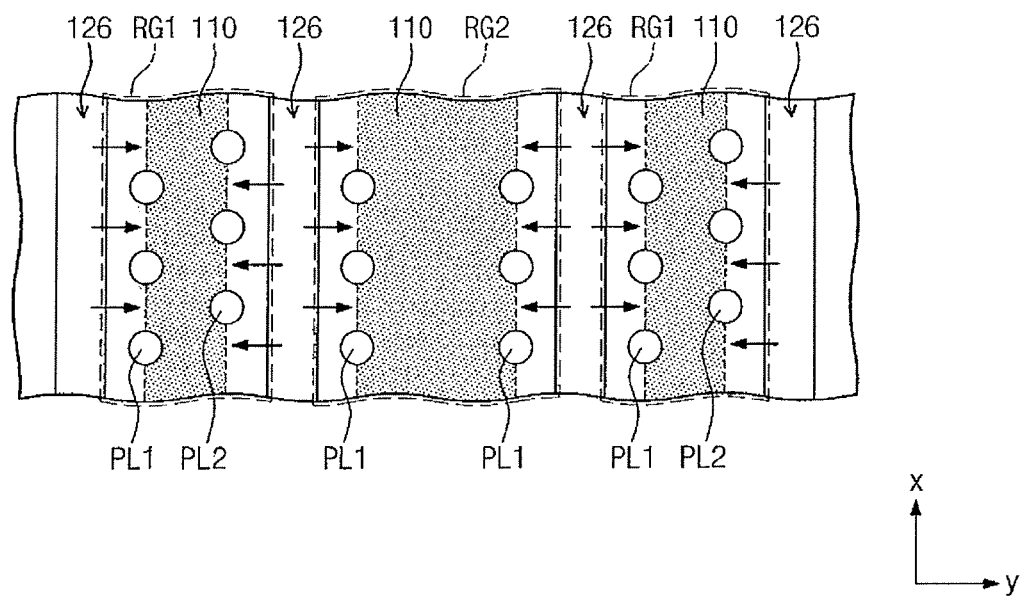
FIGS. 20 through 21 are plan views illustrating a process of forming residual insulating layers, according to an exemplary embodiment of the inventive concept.
Figure 21:
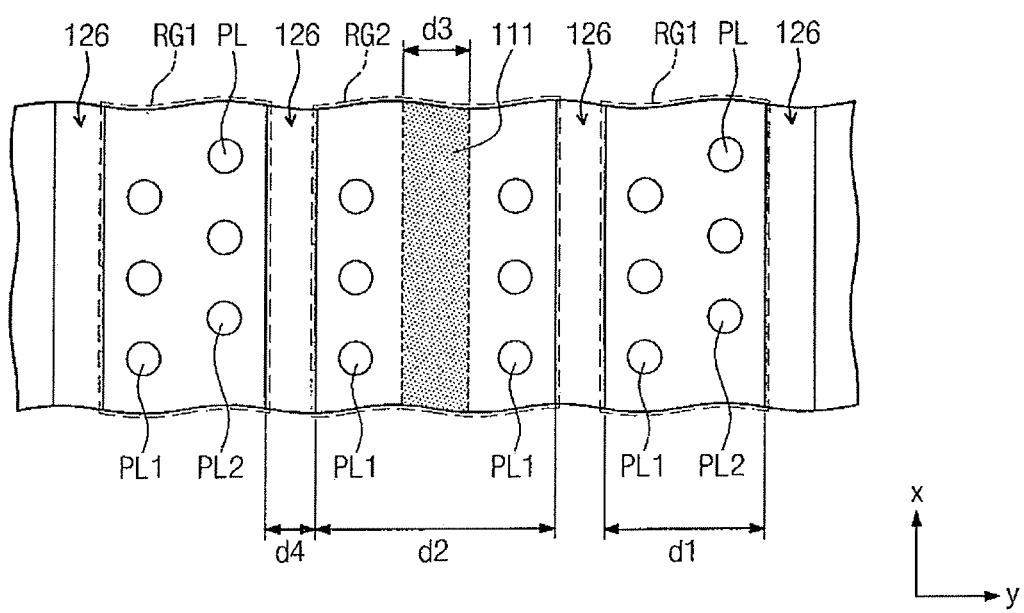

FIGS. 20 through 21 are plan views illustrating a process of forming the residual insulating layers 111 according to an exemplary embodiment of the inventive concept. For the sake of brevity, the elements and features of previously shown and described will not be described in much further detail.

As shown in FIG. 21, the cell pillars includes two kinds of arrays including a first array of cell pillars PL1 and a second array of cell pillars PL2. The second array of cell pillars PL2 is shifted by a predetermined distance in the x axis. According to an exemplary embodiment, the first sub-dielectric layers RG1 includes the first and the second cell pillars PL1 and PL2, and the second sub-dielectric layers RG2 includes two first arrays of cell pillars PL1. The two first arrays of cell pillars PL1 are spaced apart from each other by the residual insulating layer 111 interposed therebetween.

As shown in FIG. 21, the horizontal etching process may be stopped when the second insulating layers 110 disposed between the first sub-dielectric layers RG1 are completely removed. The cell pillars PL penetrating the second sub-dielectric layers RG2 may be exposed. In the case where the first and second sub-dielectric layers RG2 have widths of d1 and d2, the width d3 of the residual insulating layers 111 may equal to a width of d2−d1.

Figure 22:
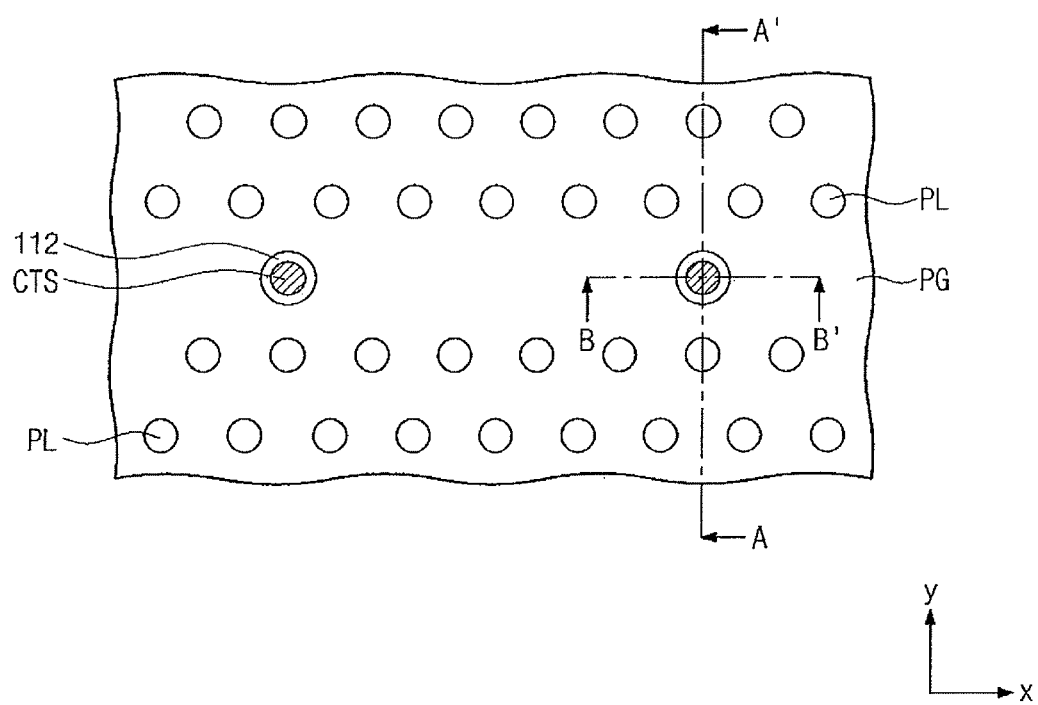
FIG. 22 is a plan view illustrating a semiconductor device and a method of fabricating the same, according to an exemplary embodiment of the inventive concept.
Figure 23:
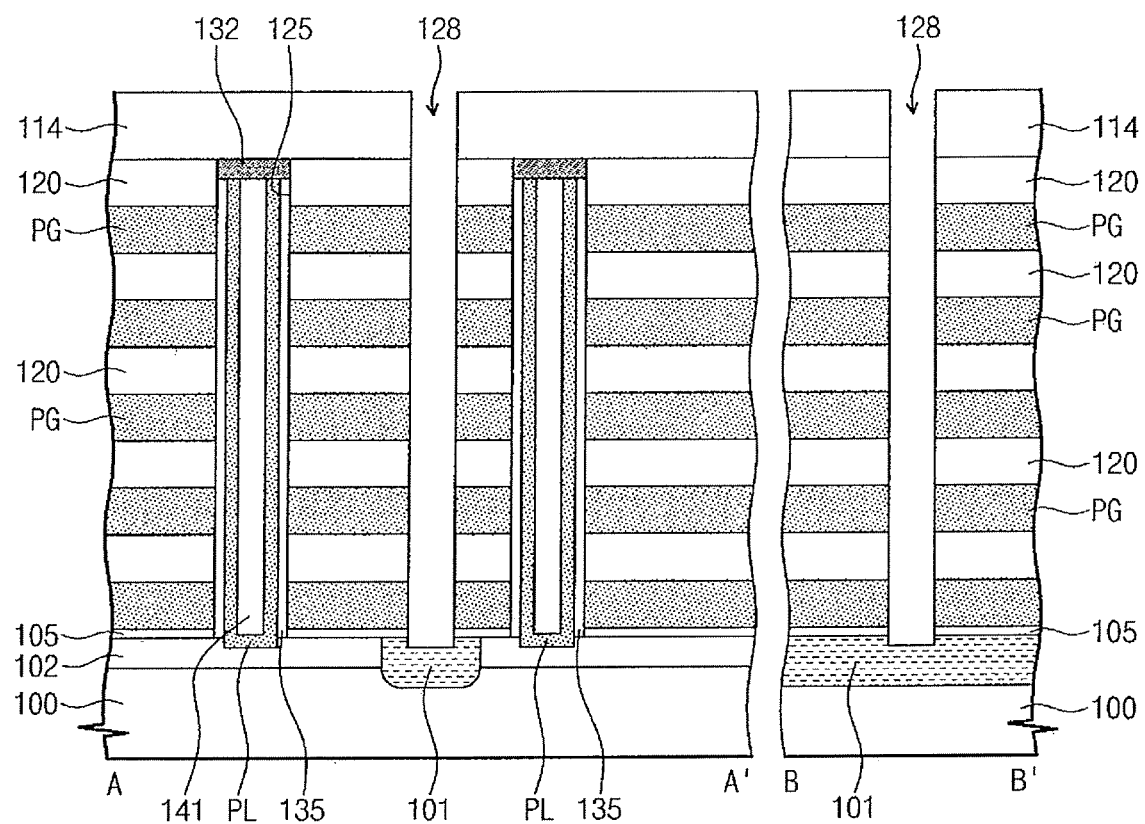
FIGS. 23 through 25 are sectional views taken along lines A-A' and B-B' of FIG. 22.
Figure 24:
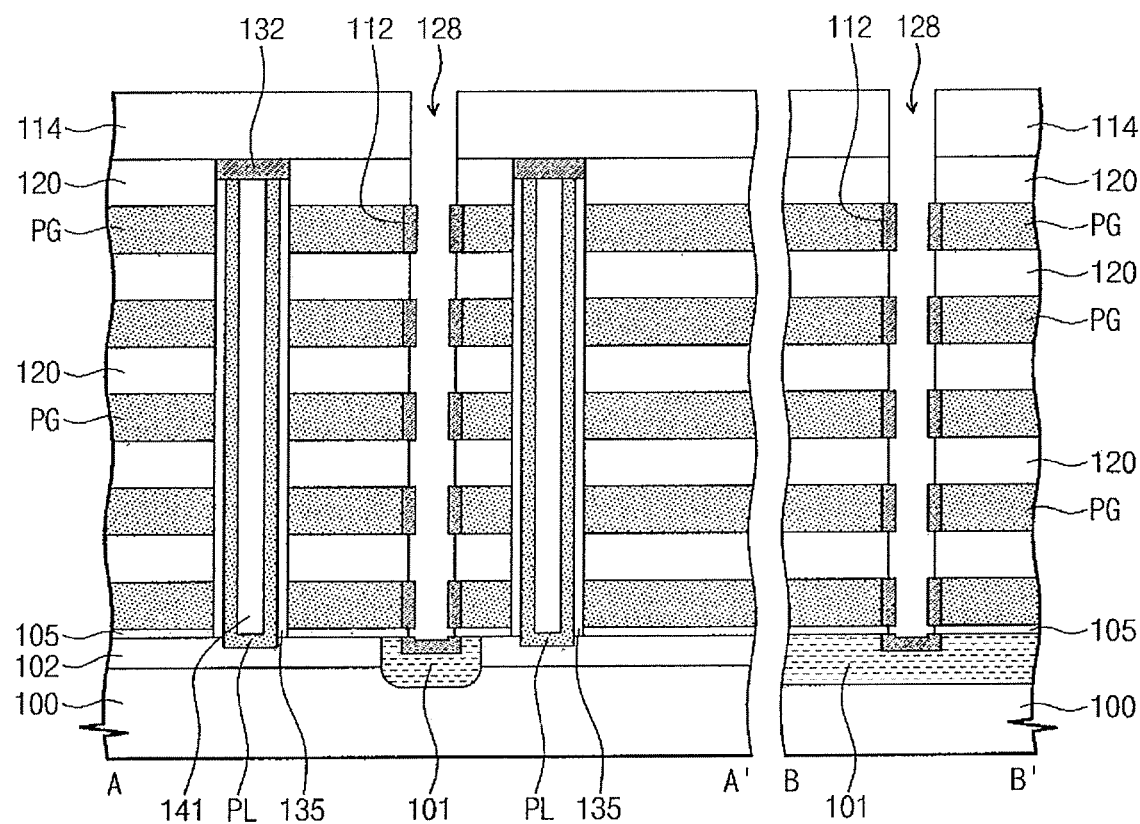
Figure 25:
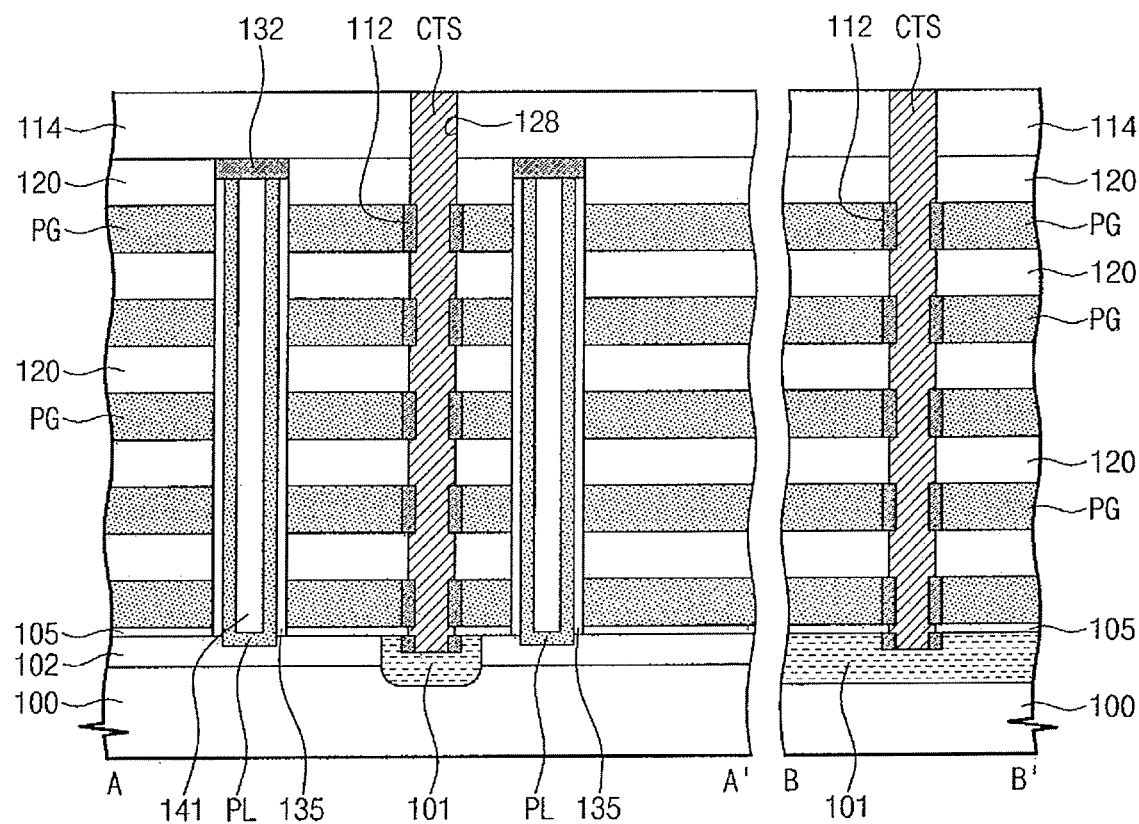

FIG. 22 is a plan view illustrating semiconductor devices and methods of fabricating the same, according to an exemplary embodiment of the inventive concept, and FIGS. 23 through 25 are sectional views taken along lines A-A' and B-B' of FIG. 22. For the sake of brevity, the elements and features of this example that are previously shown and described will not be described in much further detail.

Referring to FIGS. 22 and 23, the impurity region 102 and the first conductive region 101 are formed in an upper region of the substrate 100. The impurity region 102 is commonly connected to the cell pillars PL spaced apart from each other in both y direction and x direction. The impurity region 102 may be formed using an ion implantation process. In an exemplary embodiment, the impurity region 102 may be formed to have a different conductivity type from that of the substrate 100. The first conductive region 101 is a line-shaped doped region extending along the x direction. In an exemplary embodiment, the first conductive region 101 may include the same conductivity type as that of the substrate 100 and may have an impurity concentration higher than that of the substrate 100.

The buffer insulating layer 105 is formed on the substrate 100 provided with the impurity region 102 and the first conductive region 101. The first insulating layers 120 and the horizontal electrodes PG are alternately stacked on the buffer insulating layer 105. In an exemplary embodiment, each of the horizontal electrodes PG may include a doped semiconductor layer. The memory element 135 is formed in the cell holes 125 penetrating the first insulating layers 120 and the horizontal electrodes PG. The memory element 135 is interposed between sidewalls of the cell holes 125 and the cell pillars PL. The cell pillars PL is connected to the impurity region 102 through the memory element 135. The second conductive regions 132 are formed on the cell pillars PL. The second conductive regions 132 may be formed by partially removing upper portions of the cell pillars PL and depositing a doped polysilicon layer or a metal layer thereon. In an exemplary embodiment, the second conductive regions 132 may include n-type impurities. The first interlayered insulating layer 114 is formed to cover the cell pillars PL.

The contact hole 128 is formed to expose the substrate 100 through the first insulating layers 120 and the horizontal electrodes PG. For example, the contact hole 128 is formed to expose side surfaces of the first insulating layers 120 and the horizontal electrodes PG. The contact hole 128 may be formed by performing an anisotropic etching process. The contacts CTS are formed in the contact holes 128. The contacts CTS are connected to the first conductive regions 101, respectively.

Referring to FIGS. 22 and 24, second insulating layers 112 are locally formed on the side surfaces of the horizontal electrodes PG exposed by the contact holes 128. The second insulating layers 112 are also formed on the top surface of the substrate 100 exposed by the contact holes 128. In an exemplary embodiment, the second insulating layers 112 may include oxide layers, which may be formed by thermally oxidizing the exposed side surfaces of the horizontal electrodes PG.

Referring to FIGS. 22 and 25, the contact plugs CTS are formed in the contact holes 128. The contact plugs CTS are connected to the first conductive regions 101, respectively. In an exemplary embodiment, before the formation of the contact plugs CTS, an etching process may be further performed to remove partially the second insulating layers 112 and expose the top surface of the first conductive regions 101.

Each of the second insulating layers 112 are formed to surround the contact plugs CTS. For example, each of the second insulating layers 112 may be shaped like a ring being in contact with the contact plugs CTS. The contact plugs CTS are electrically separated from the horizontal electrodes PG by the second insulating layers 112 and the first insulating layers 120.

Figure 26:
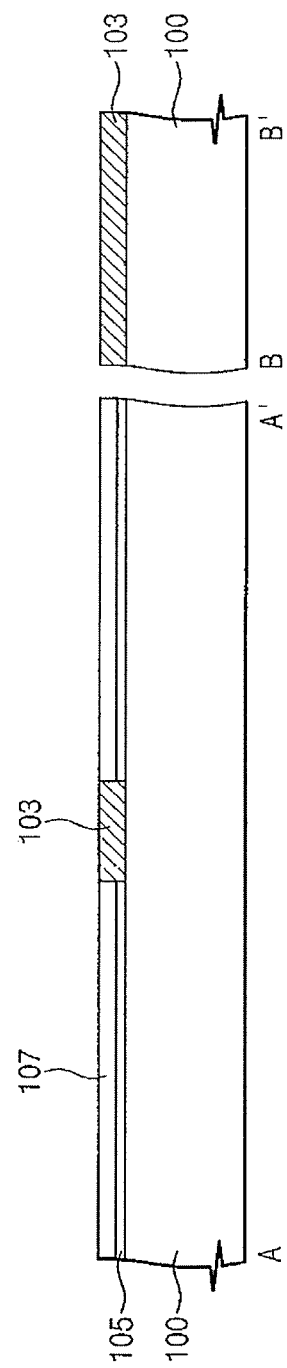
FIGS. 26 and 27 are sectional views illustrating a process of forming a first conductive region according to an exemplary embodiment of the inventive concept, taken along lines A-A' and B-B' of FIG. 3.
Figure 27:
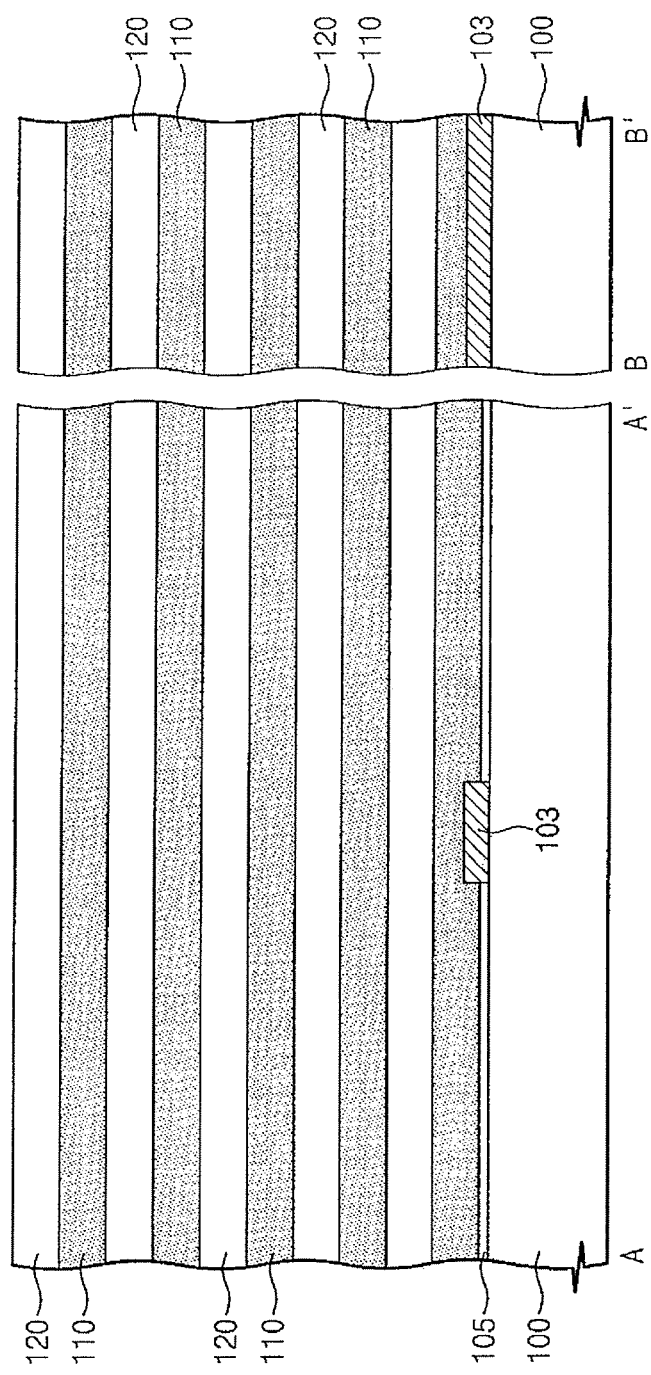

FIGS. 26 and 27 are sectional views illustrating a process of forming a first conductive region according to an exemplary embodiment of the inventive concept, taken along lines A-A' and B-B' of FIG. 3.

Referring to FIGS. 3 and 26, a first conductive region 103 is formed on the top surface of the substrate 100 exposed by the buffer insulating layer 105 and a mask layer 107. The first conductive region 103 may include a metal layer and/or a metal silicide layer. In an exemplary embodiment, the first conductive region 103 is formed to fill a gap region delimited by the mask layer 107. Alternatively, the first conductive region 103 may be formed by forming and patterning a metal layer and/or a metal silicide layer on the substrate 100. The first conductive region 103 includes a line-shaped structure extending along the x direction.

Referring to FIGS. 3 and 27, the second insulating layers 110 and the first insulating layers 120 are alternately stacked on the resulting structure provided with the first conductive region 103. In an exemplary embodiment, the mask layer 107 may be removed before the formation of the insulating layers 110 and 120.

The subsequent processes may be performed in the same manner as those described with reference to FIGS. 5 through 11 and thus further detail descriptions will be omitted.

Figure 28:
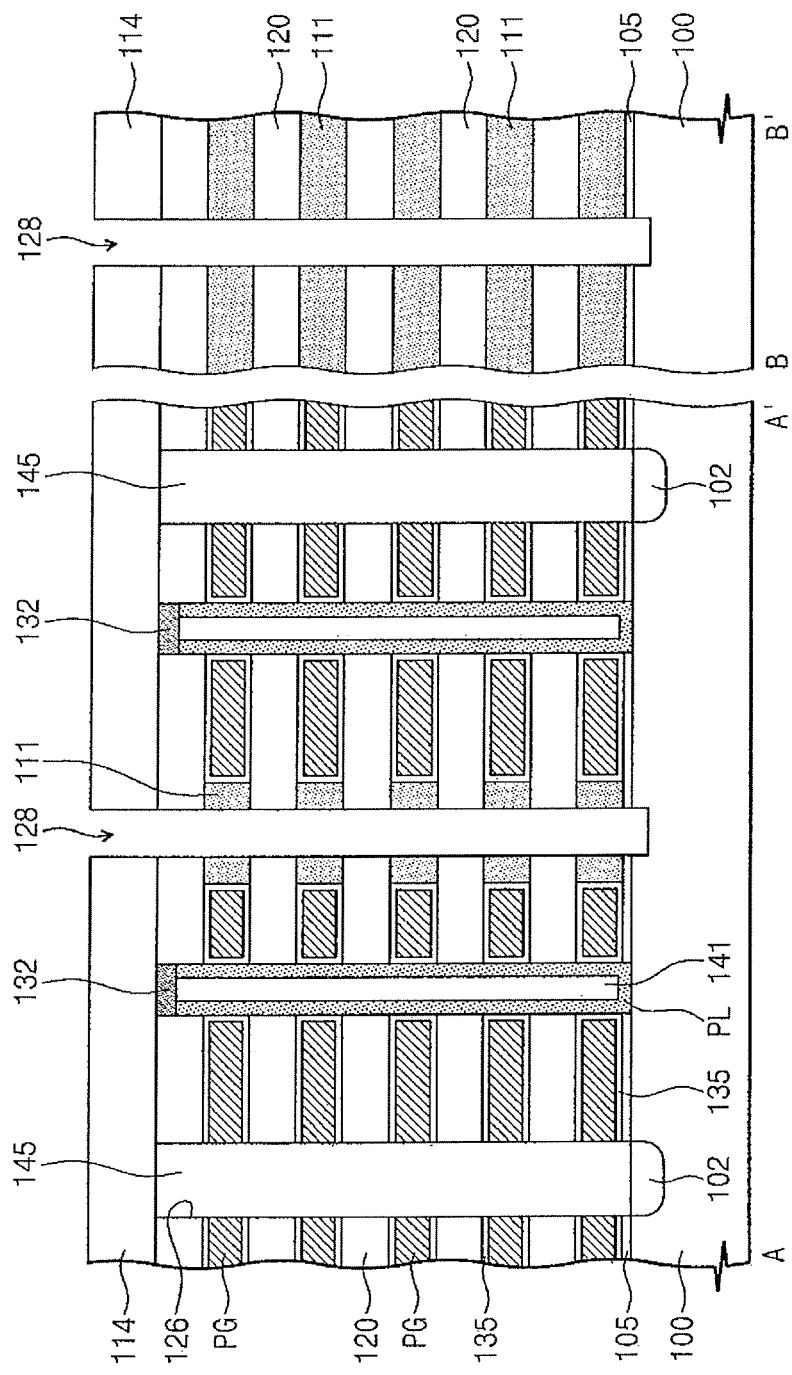
FIGS. 28 and 29 are sectional views illustrating a process of forming a first conductive region according to an exemplary embodiment of the inventive concept, taken along lines A-A' and B-B' of FIG. 3.
Figure 29:
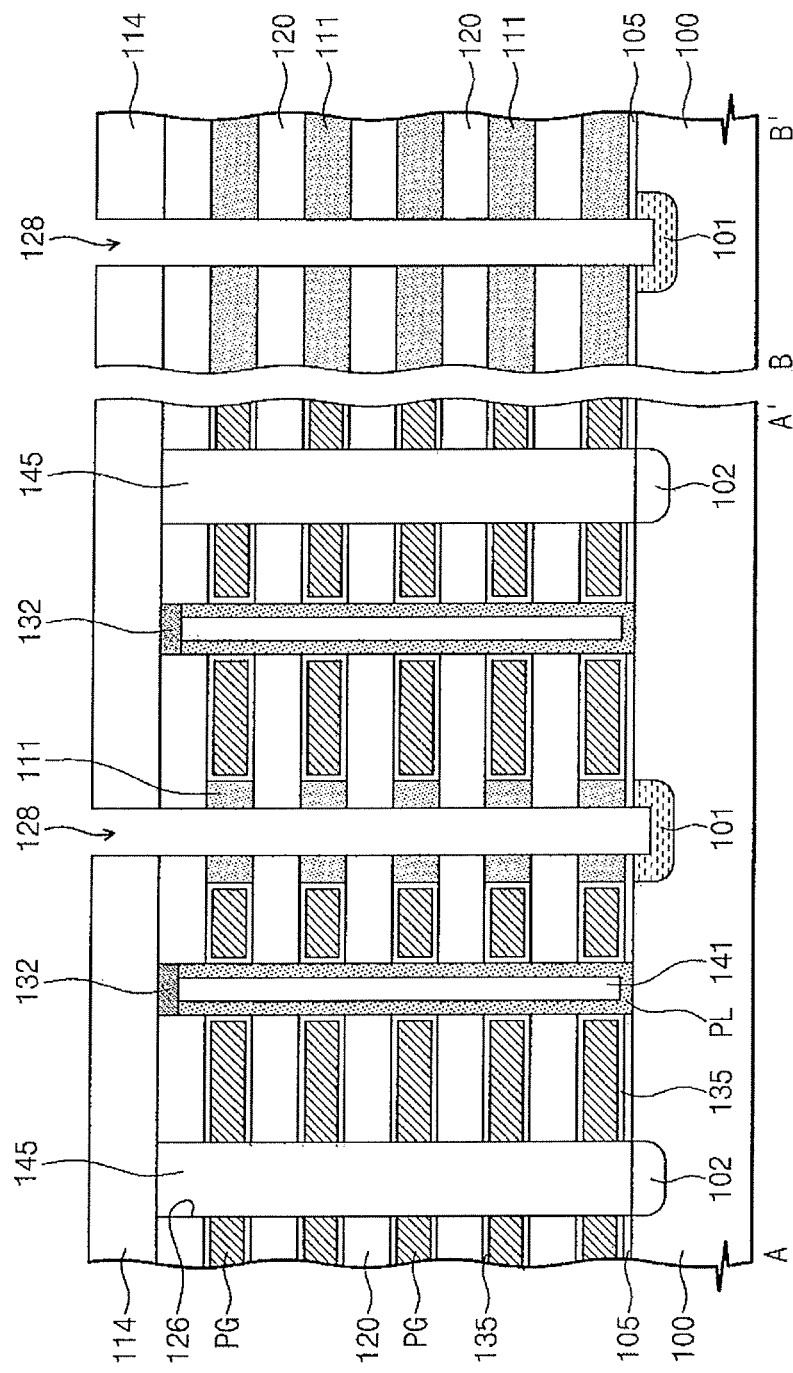

FIGS. 28 and 29 are sectional views illustrating a process of forming a first conductive region according to an exemplary embodiment of the inventive concept, taken along lines A-A' and B-B' of FIG. 3.

The first conductive region 101 of FIG. 29 may be formed after the formation of the horizontal electrodes PG. For example, as shown in FIGS. 28 and 29, the first conductive region 101 may be formed by an ion implantation process, which is performed after the formation of the contact hole 128 penetrating the residual insulating layers 111 and the first insulating layers 120. In the case where the number of the contact holes 128 is two or more, the first conductive region 101 may include a plurality of impurity regions separated from each other and may be formed below the plurality of the contact holes 128, respectively.

FIGS. 30A through 30D are sectional views illustrating memory elements according to exemplary embodiments of the inventive concept.

Figure 30A:
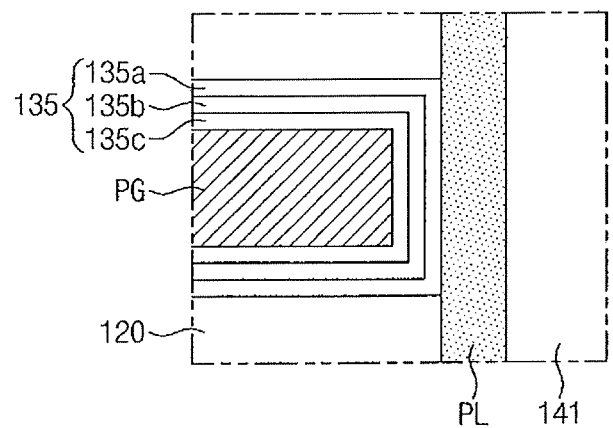
FIGS. 30A through 30D are sectional views illustrating memory elements according to some exemplary embodiments of the inventive concept.

Referring to FIG. 30A, the memory element 135 includes a blocking insulating layer 135c formed on the horizontal electrodes PG, a tunnel insulating layer 135a formed on the cell pillars PL and a charge storing layer 135b interposed therebetween. The memory element 135 is partially interposed between the horizontal electrodes PG and the first insulating layers 120. The blocking insulating layer 135c may include a high-k dielectric layer, such as an aluminum oxide layer or a hafnium oxide layer. The blocking insulating layer 135c may include a multi-layered structure including a plurality of layers. The charge storing layer 135b may include a charge-trap layer or an insulating layer provided with conductive nano particles. For example, the charge-trap layer may include a silicon nitride layer. The tunnel insulating layer 135a may include a silicon oxide layer.

Figure 30B:
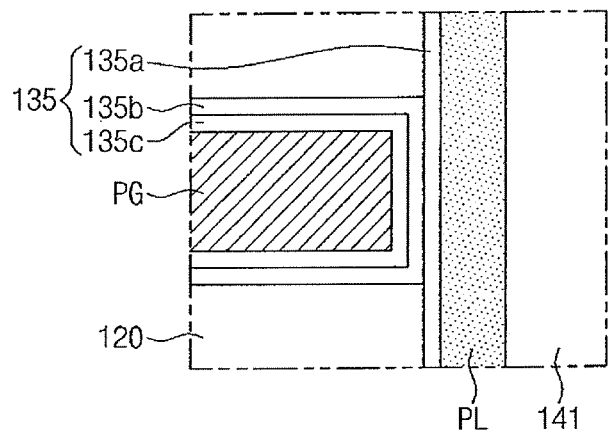
Figure 30C:
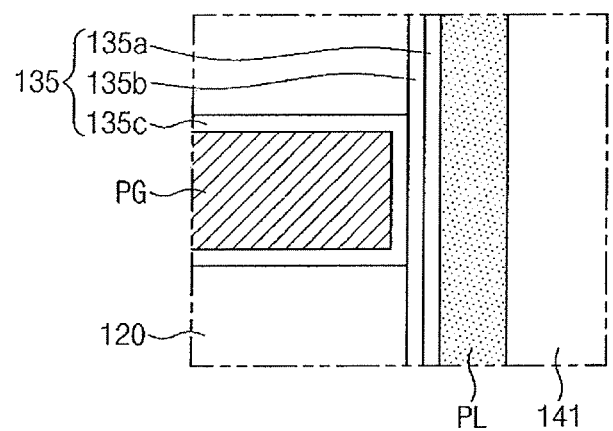
Figure 30D:
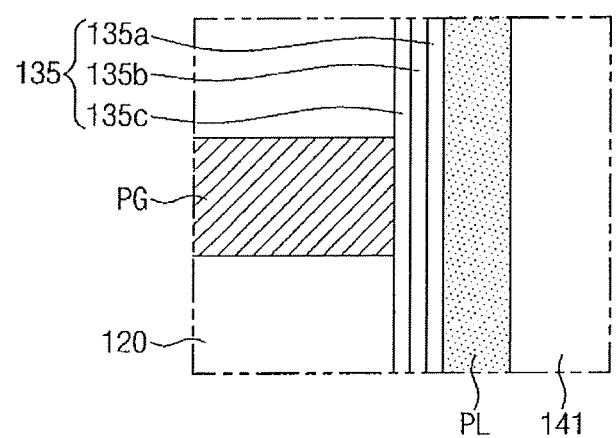

Referring to FIGS. 30B through 30D, unlike that shown in FIG. 30A, at least a portion of the memory element 135 is partially interposed between the first insulating layers 120 and the cell pillars PL. Referring to FIG. 30B, the tunnel insulating layer 135a is extended between the first insulating layers 120 and the cell pillars PL, and the charge storing layer 135b and the blocking insulating layer 135c are extended between the first insulating layers 120 and the horizontal electrodes PG. Referring to FIG. 30C, the tunnel insulating layer 135a and the charge storing layer 135b are extended between the first insulating layers 120 and the cell pillars PL, and the blocking insulating layer 135c is extended between the first insulating layers 120 and the horizontal electrodes PG. Referring to FIG. 30D, the tunnel insulating layer 135a, the charge storing layer 135b, and the blocking insulating layer 135c are extended between the first insulating layers 120 and the cell pillars PL.

FIGS. 31A through 31D are sectional views illustrating memory elements according to exemplary embodiments of the inventive concept.

Figure 31A:
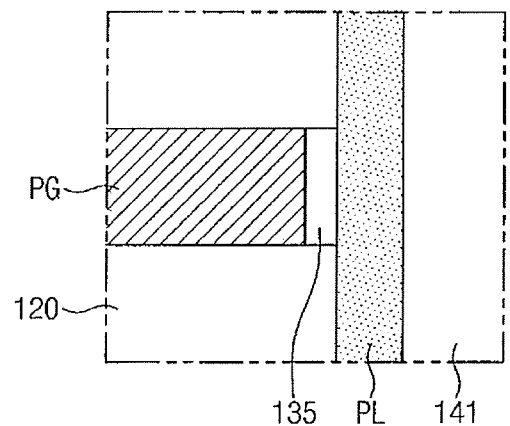
FIGS. 31A through 31D are sectional views illustrating memory elements according to exemplary embodiments of the inventive concept.
Figure 31B:
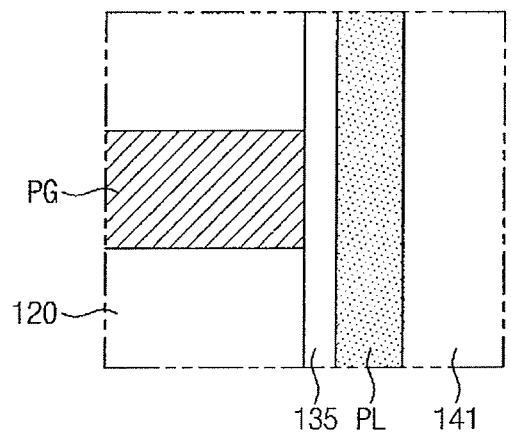
Figure 31C:
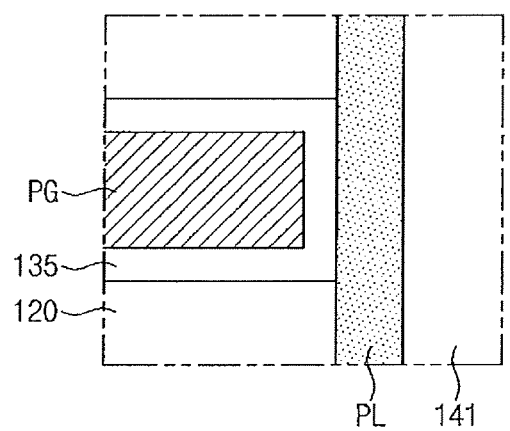

The cell pillars PL may include a conductive material. For example, the cell pillars PL may include a doped semiconductor layer, a metal layer, a conductive metal nitride layer, a silicide layer, and/or a nano structure (e.g., carbon nanotube or graphene). In an exemplary embodiment, the memory element 135 may include a variable resistance pattern. The variable resistance pattern may include materials having a variable resistance property. Referring to FIG. 31A, the memory element 135 is formed and localized between the horizontal electrodes PG and the cell pillars PL. Referring to FIG. 31B, the memory element 135 is extended between the first insulating layers 120 and the cell pillars PL and is further extended between the horizontal electrodes PG and the cell pillars PL. Referring to FIG. 31C, the memory element 135 is formed between the horizontal electrodes PG and the cell pillars PL and is further extended between the first insulating layers 120 and the horizontal electrodes PG.

The memory element 135 may include a material (for example, a phase-changeable material), whose electric resistance may be changed according to thermal energy applied thereto. Thermal energy may be generated by an electric current passing through an electrode adjacent to the memory element 135. The phase-changeable material may include antimony (Sb), tellurium (Te), and/or selenium (Se). For example, the phase-changeable material may have the properties of chalcogenide glasses. The material may include tellurium (Te) having about 20 to about 80 atomic percent concentration, antimony (Sb) having about 5 to about 50 atomic percent concentration, and germanium (Ge) having the remaining concentration. In addition, the phase-changeable material may further include impurities such as N, O, C, Bi, In, B, Sn, Si, Ti, Al, Ni, Fe, Dy, and/or La. In an exemplary embodiment, the memory element 135 may include GeBiTe, InSb, GeSb, and/or GaSb.

The memory element 135 may be configured to have a layered structure whose electric resistance may be changed according to a spin transferring phenomenon of an electric current flowing through the memory element 135. For example, the memory element 135 may be configured to have a layered structure exhibiting a magneto-resistance property and may include at least one ferromagnetic material and/or at least one antiferromagnetic material.

The memory element 135 may include perovskite compounds or transition metal oxides. For example, the memory element 135 may include niobium oxide, titanium oxide, nickel oxide, zirconium oxide, vanadium oxide, PCMO((Pr, Ca)MnO3), strontium-titanium oxide, barium-strontium-titanium oxide, strontium-zirconium oxide, barium-zirconium oxide, and/or barium-strontium-zirconium oxide.

Figure 31D:
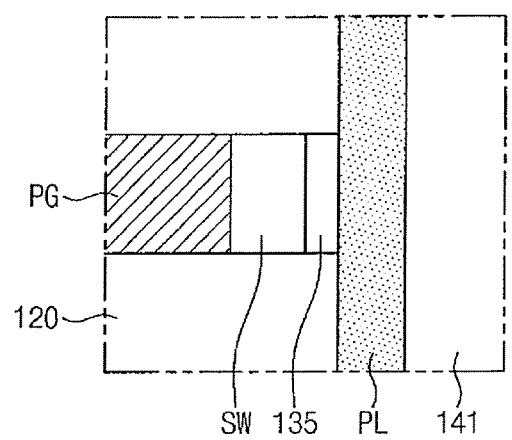

Referring to FIG. 31D, a switching element SW is interposed between the memory element 135 and the horizontal electrodes PG. The switching element SW may include a material exhibiting a self-rectifying property or a nonlinear current-voltage property. For example, the switching element SW may be configured to form a pn-junction diode.

Figure 32:
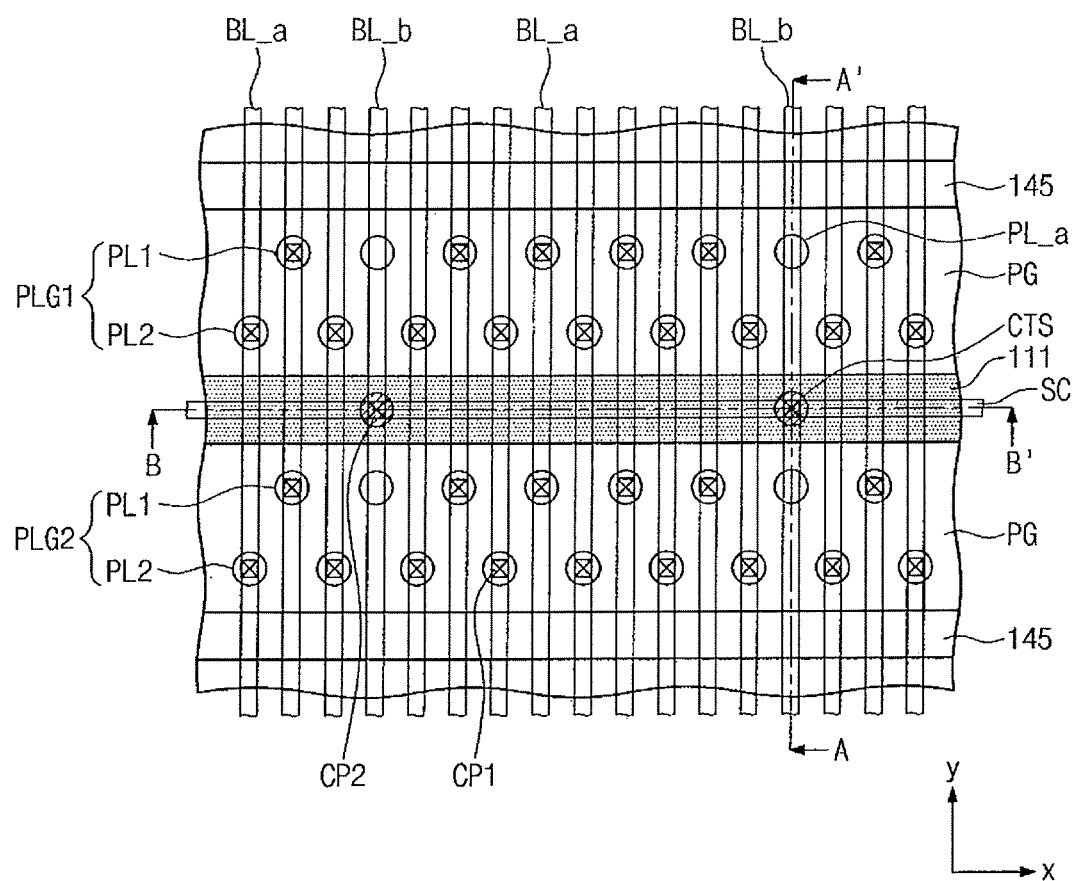
FIG. 32 is a plan view illustrating an example of interconnection between conductive lines, according to an exemplary embodiment of the inventive concept.
Figure 33:
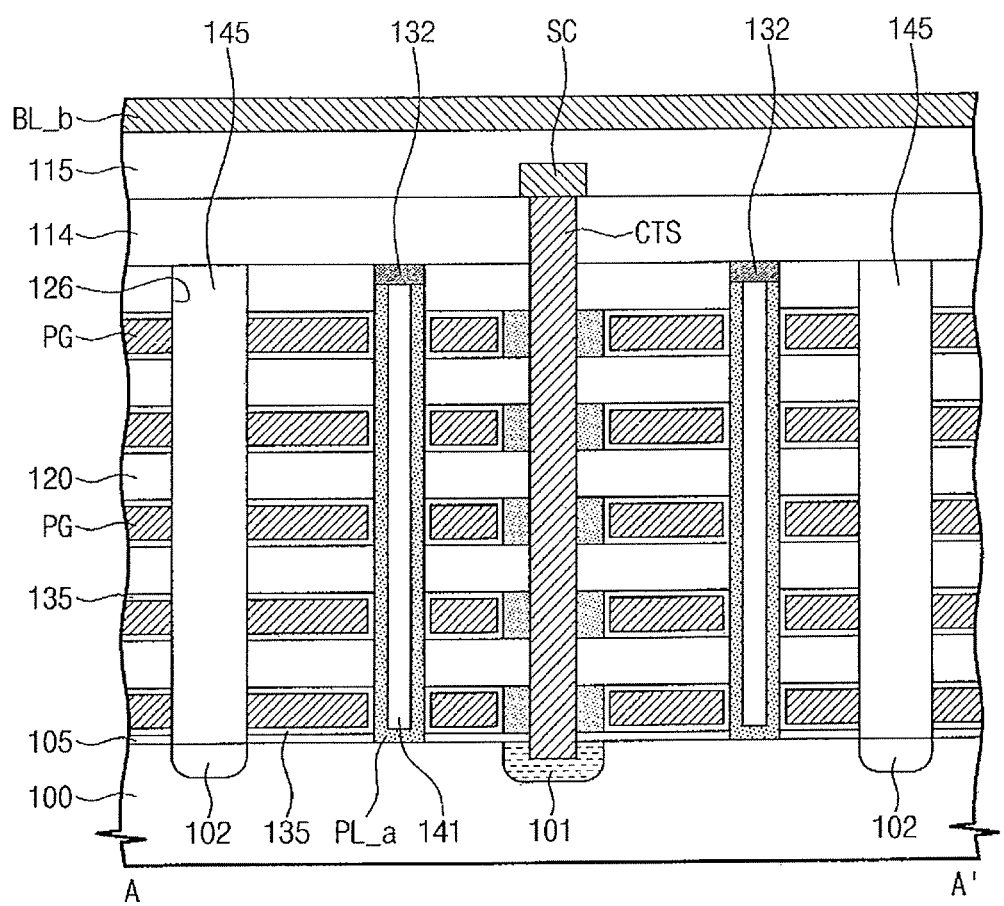
FIGS. 33 and 35 are sectional views taken along a line A-A' of FIG. 32, and FIGS. 34 and 36 are sectional views taken along a line B-B' of FIG. 32.
Figure 34:
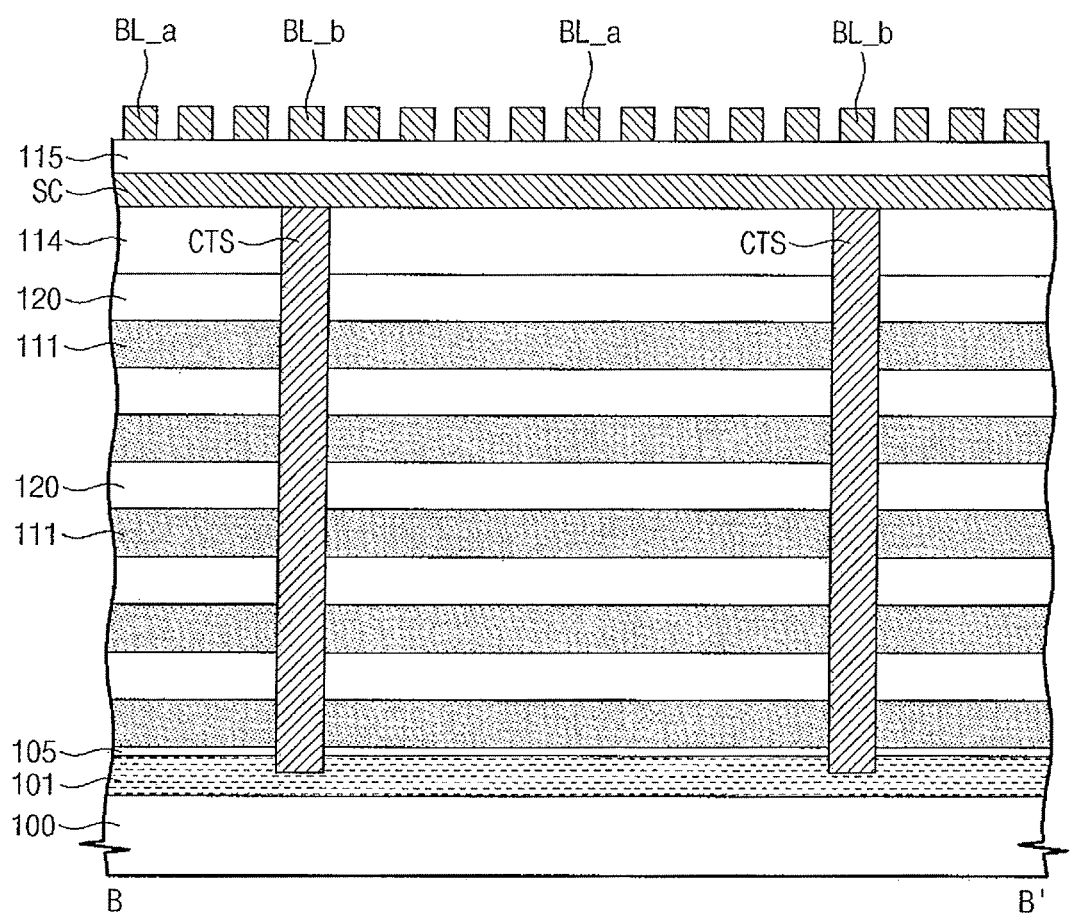
Figure 35:
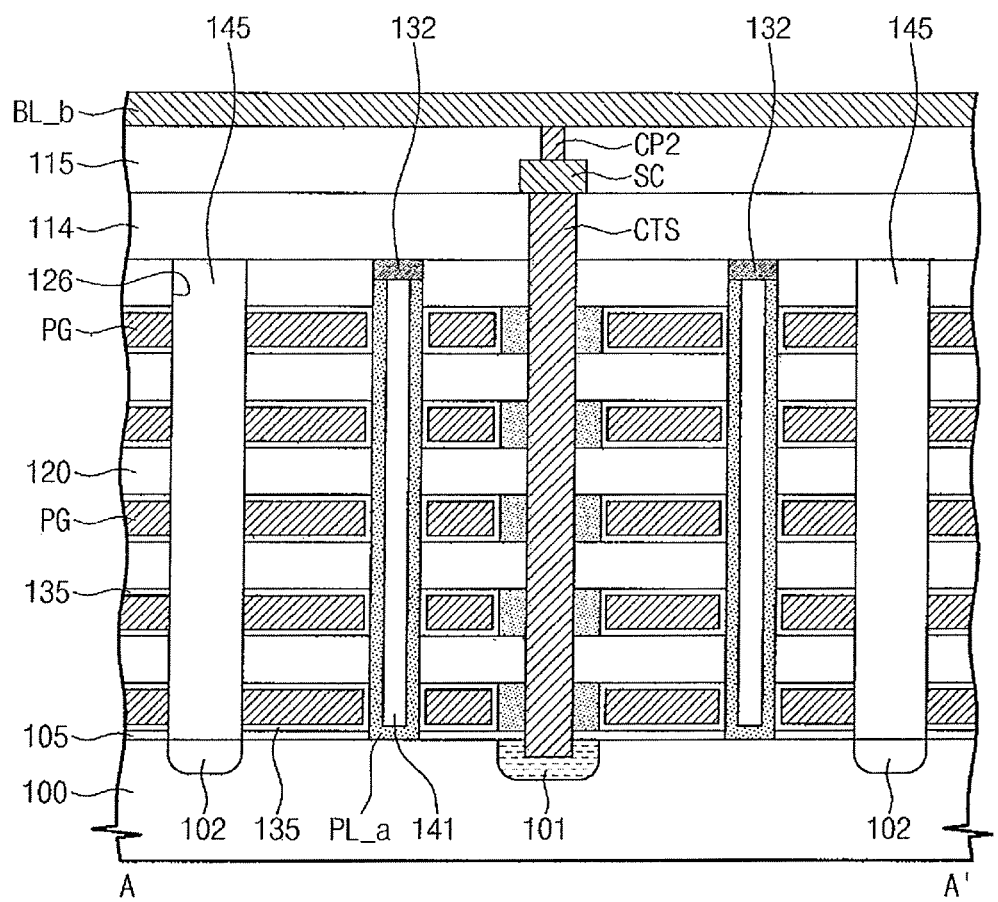
Figure 36:
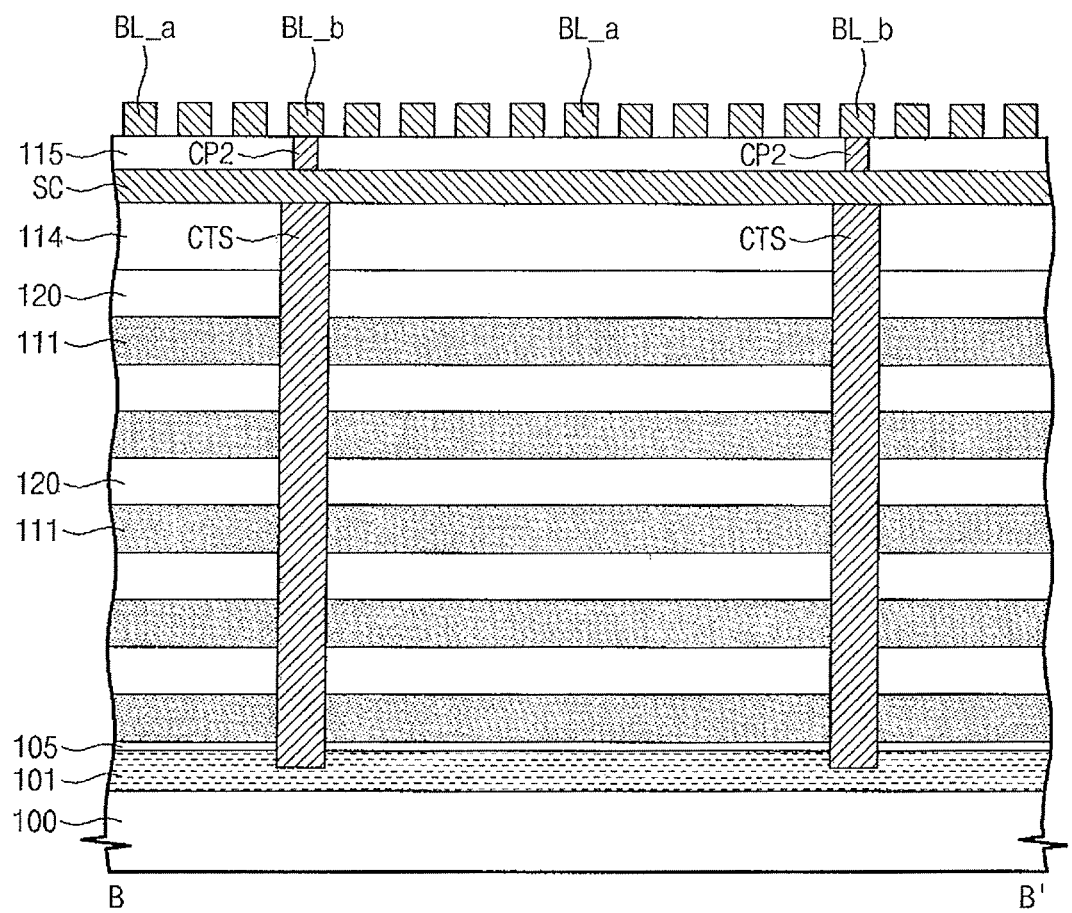

FIG. 32 is a plan view illustrating an example of interconnection between conductive lines, according to an exemplary embodiment of the inventive concept. FIGS. 33 and 35 are sectional views taken along line A-A' of FIG. 32, and FIGS. 34 and 36 are sectional views taken along line B-B' of FIG. 32.

Referring to FIGS. 32 through 36, bit lines BL_a and BL_b are provided to connect the cell pillars to each other. The cell pillars PL1 and PL2 are grouped into cell groups PLG1 and PLG2 separated by the residual insulating layer 111. Each of the cell groups PLG1 and PLG2 includes the first cell pillars PL1 arranged in a first row, extending in the x direction, adjacent to the separation layers 145 and the second cell pillars PL2 arranged in a second row, extending in the x direction, between the first row and the residual insulating layer 111. Along the x direction, the second cell pillars PL2 are shifted by a predetermined distance in the x direction and thus are located between the first cell pillars PL1. The cell groups PLG1 and PLG2 adjacent to each other have substantially the same arrangement of the cell pillars PL1 and PL2. Alternatively, the cell groups PLG1 and PLG2 adjacent to each other may be configured to have a mirror-symmetric arrangement of the cell pillars with respect to each other. The inventive concepts are not limited to a cell group having the two rows of cell pillars PL1 and PL2, but may include a cell group having three or more rows of cell pillars.

A contact connection line SC may serve to connect the contact plugs CTS to each other. The contact connection line SC and the bit lines BL_a and BL_b may include a metal layer and/or a conductive metal nitride layer. The contact connection line SC may be used to apply a predetermined voltage to the substrate 100 through the contact plugs CTS and the first conductive region 101. The contact connection line SC may extend along the extending direction (e.g., the x direction) of the residual insulating layers 111. In an exemplary embodiment, the contact connection line SC is provided between the bit lines BL_a and BL_b and the contact plugs CTS. For example, the contact connection line SC is formed on the contact plugs CTS, connecting the contact plugs CTS to each other. The contact connection line SC is further positioned under the bit lines BL_a and BL_b. Alternatively, the contact connection line SC may be provided on the bit lines BL_a and BL_b.

The bit lines BL_a and BL_b cross the separation layers 145 and the residual insulating layers 111. In an exemplary embodiments, the first bit lines BL_a does not overlap the contact plugs CTS, and the second bit lines BL_b overlaps the contact plugs CTS. The first cell pillars PL1 of the first and second cell groups PLG1 and PLG2 may be connected to the same first bit line BL_a through the first bit line contact plugs CP1.

The cell pillars PL_a overlapped with the second bit lines BL_b are not connected to the second bit lines BL_b. In an exemplary embodiment, as shown in FIGS. 33 and 34, the second bit lines BL_b is electrically separated from the contact connection line SC by a second interlayered insulating layer 115. Alternatively, as shown in FIGS. 35 and 36, the second bit lines BL_b is electrically connected to the contact connection line SC via second bit line plugs CP2 penetrating the second interlayered insulating layer 115. In this case, the second bit lines BL_b may serve to apply a predetermined voltage to the first conductive region 101.

Figure 37:
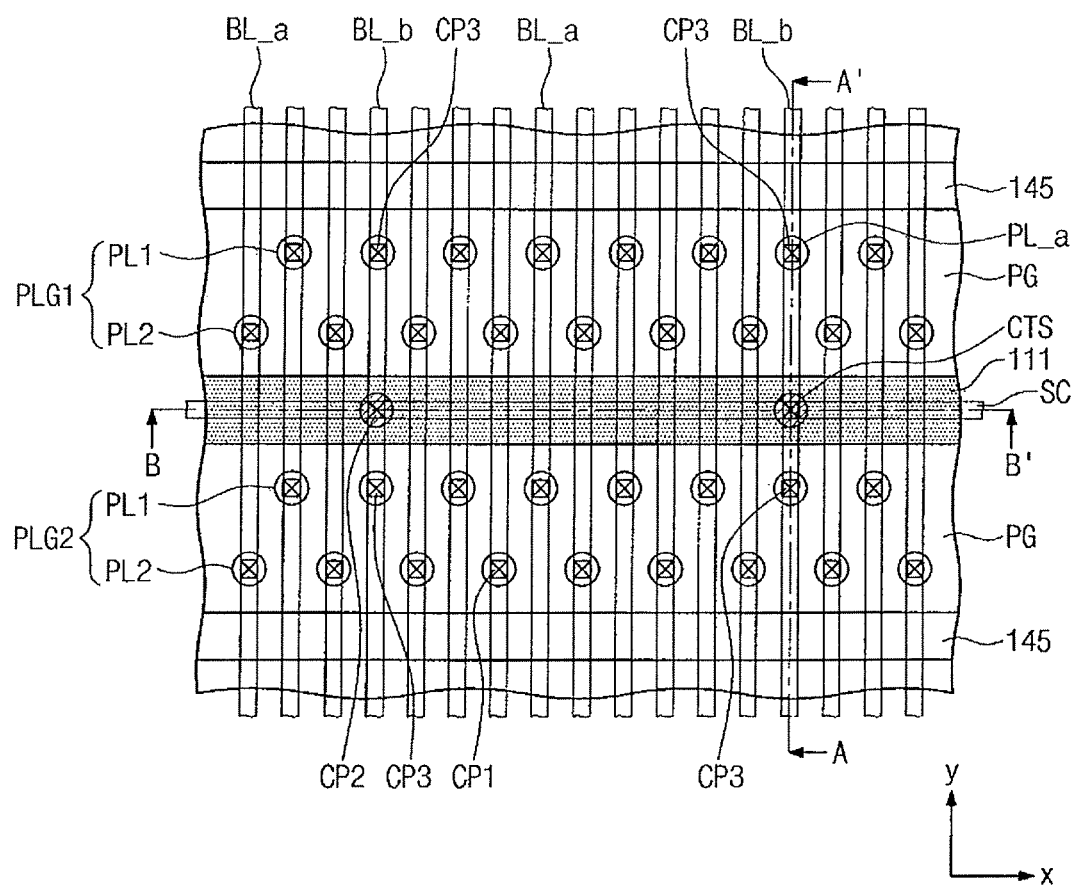
FIG. 37 is a plan view illustrating an example of interconnection between conductive lines, according to an exemplary embodiment of the inventive concept.
Figure 38:
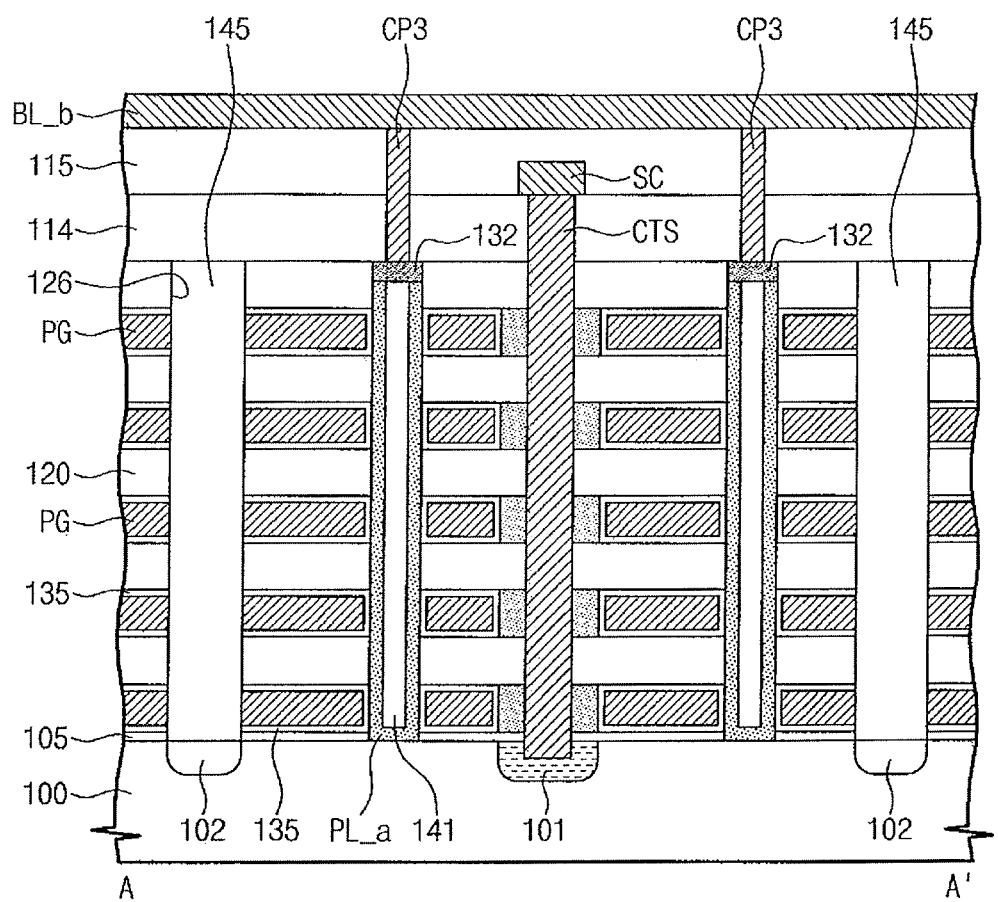
FIGS. 38 and 40 are sectional views taken along a line A-A' of FIG. 37, and FIGS. 39 and 41 are sectional views taken along a line B-B' of FIG. 37.
Figure 39:
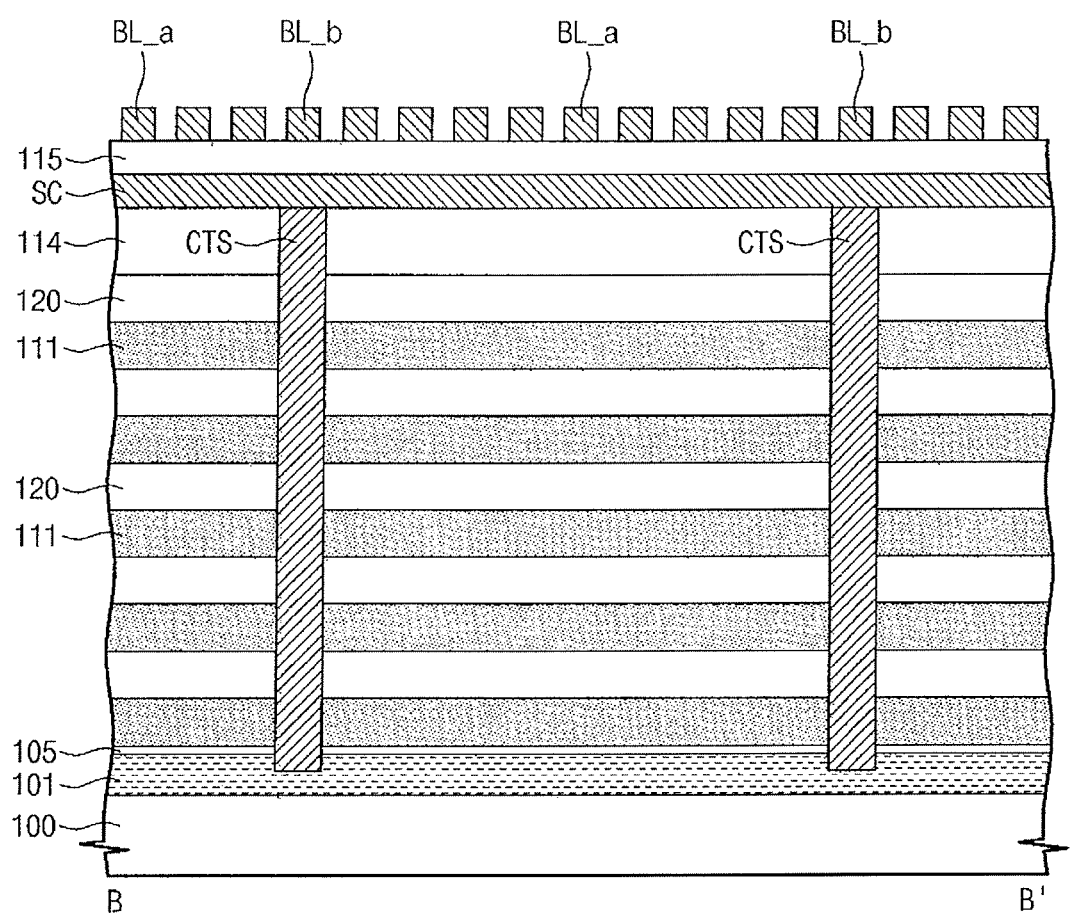
Figure 40:
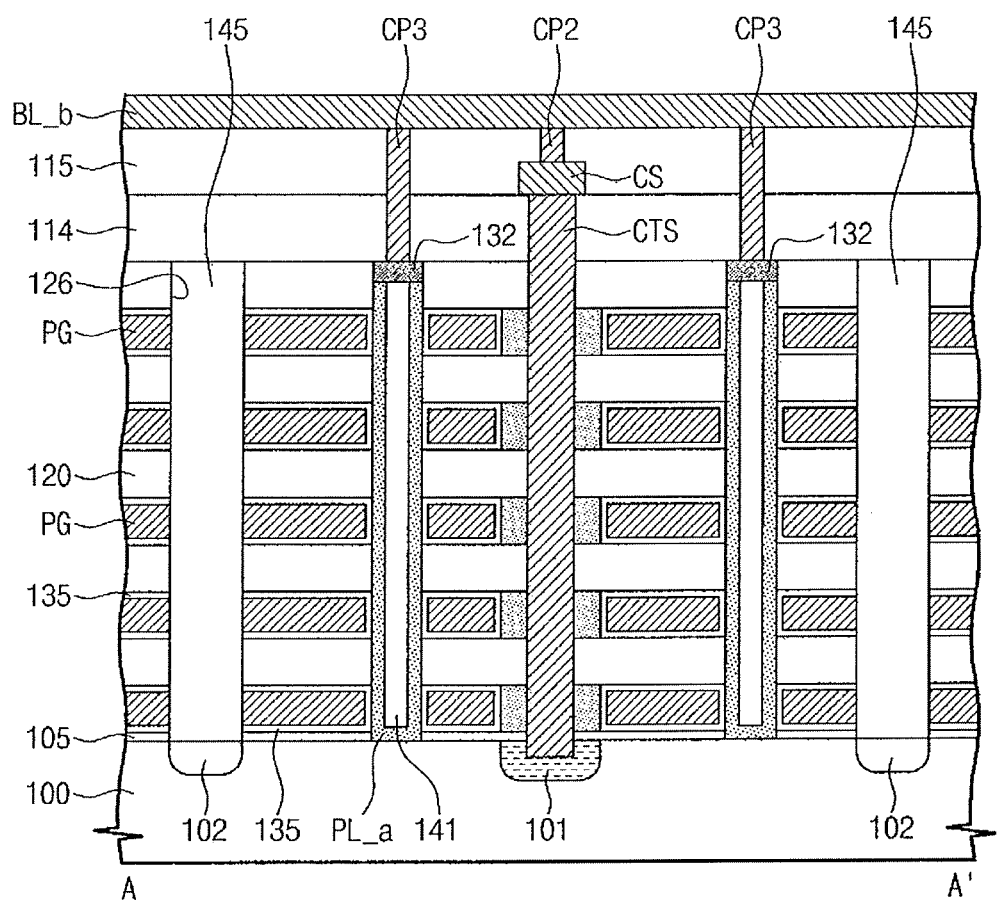
Figure 41:
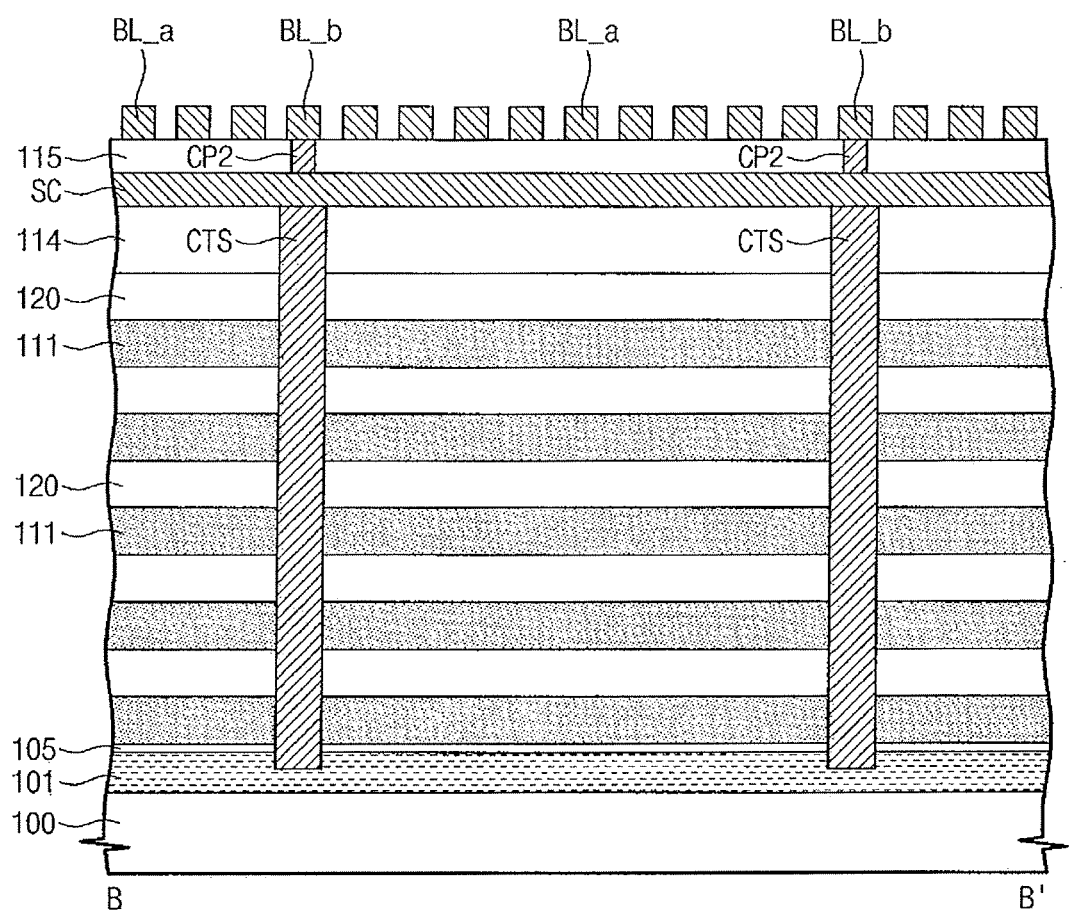

FIG. 37 is a plan view illustrating an example of interconnection between conductive lines, according to an exemplary embodiment of the inventive concept. FIGS. 38 and 40 are sectional views taken along line A-A' of FIG. 37, and FIGS. 39 and 41 are sectional views taken along line B-B' of FIG. 37. For the sake of brevity, the elements and features of this example that are previously shown and described will not be described in much further detail.

According to an exemplary embodiment, the cell pillars PL_a overlapped with the second bit lines BL_b are connected to the second bit lines BL_b via the third bit line plugs CP3. In an exemplary embodiment, as shown in FIGS. 38 and 39, the second bit lines BL_b is electrically separated from the contact connection line SC by the second interlayered insulating layer 115. Alternatively, as shown in FIGS. 40 and 41, the second bit lines BL_b are electrically connected to the contact connection line SC via the second bit line plugs CP2 penetrating the second interlayered insulating layer 115. In this case, the second bit lines BL_b may serve to apply a predetermined voltage to the substrate 100. In addition to the contact plugs CTS, the cell pillars PL_a connected to the second bit lines BL_b also apply a predetermined voltage to the substrate 100.

Figure 42:
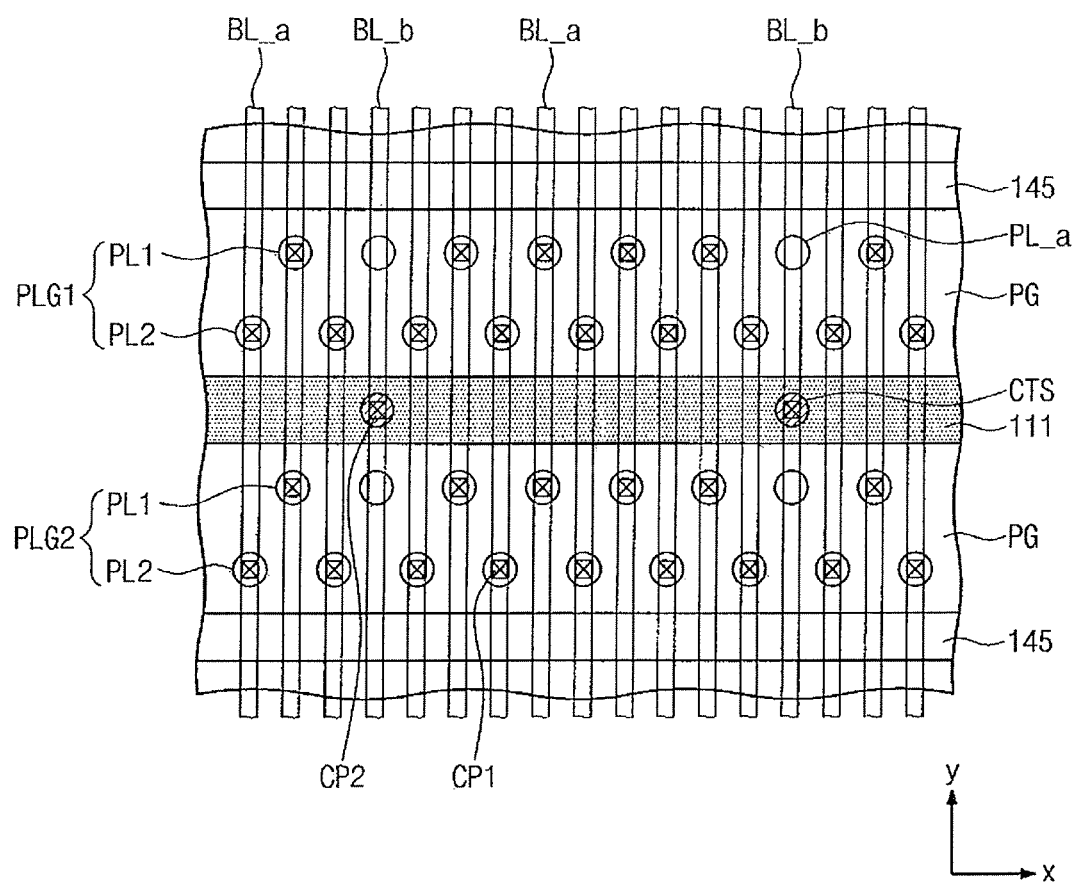
FIGS. 42 and 43 are plan views illustrating examples of interconnection between conductive lines, according to exemplary embodiments of the inventive concept.
Figure 43:
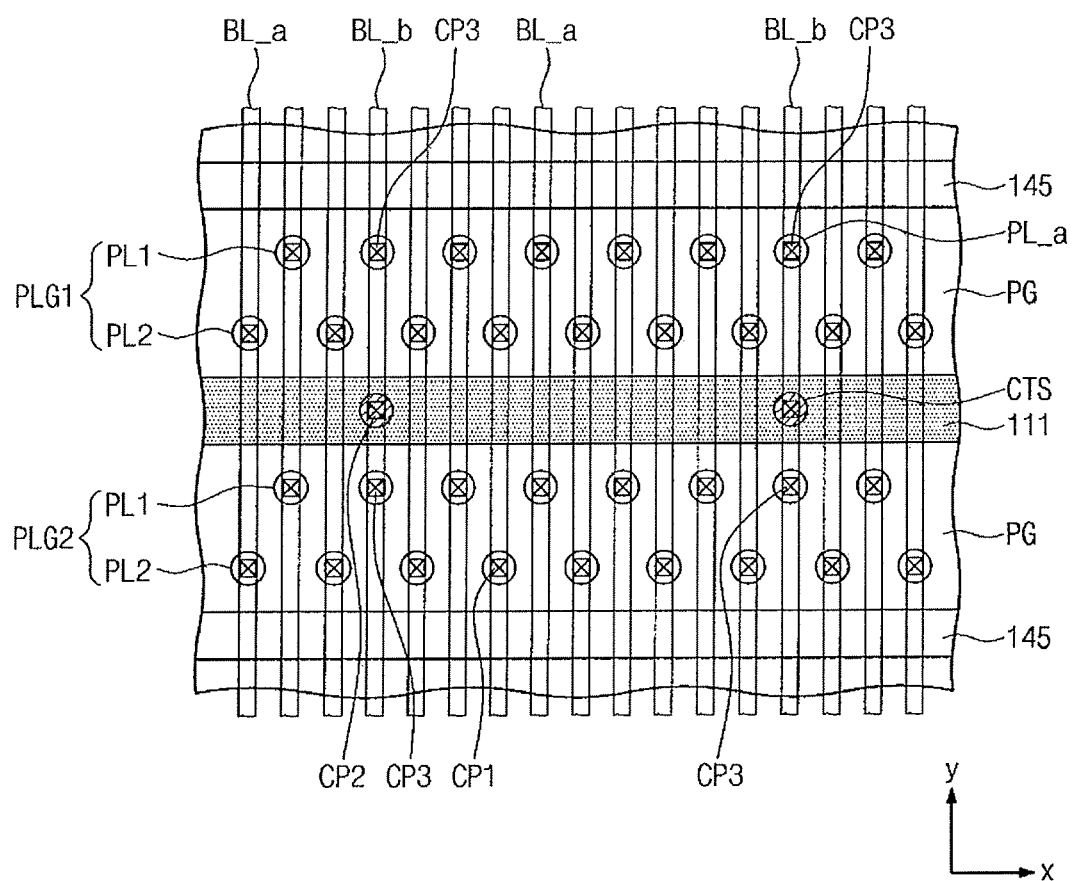

FIGS. 42 and 43 are plan views illustrating examples of interconnection between conductive lines, according to an exemplary embodiment of the inventive concept. The second bit lines BL_b is connected to the contact plugs CTS via the second bit line plugs CP2, without the contact connection line SC. The second bit lines BL_b may be electrically connected to each other by an additional conductive line (not shown). As shown in FIG. 42, the cell pillars PL_a overlapped with the second bit lines BL_b are not be connected to the second bit lines BL_b. Alternatively, as shown in FIG. 43, the cell pillars PL_a overlapped with the second bit lines BL_b are connected to the second bit lines BL_b via the third bit line plugs CP3. In this case, the cell pillars PL_a connected to the second bit lines BL_b, along with the contact plugs CTS, may serve to apply a predetermined voltage to the substrate 100.

Figure 44:
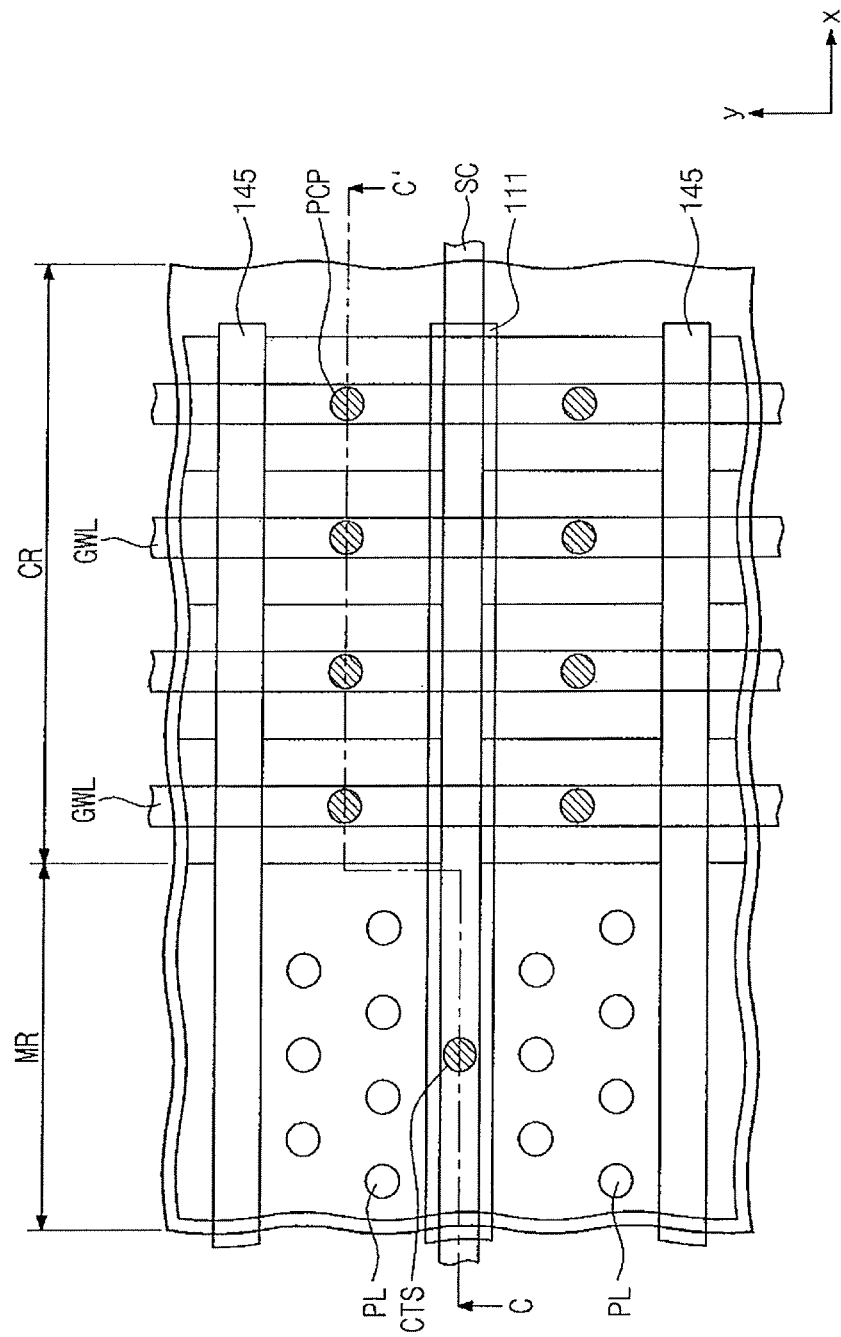
FIG. 44 is a plan view illustrating a memory cell region and a pad contact region, according to an exemplary embodiment of the inventive concept.
Figure 45:
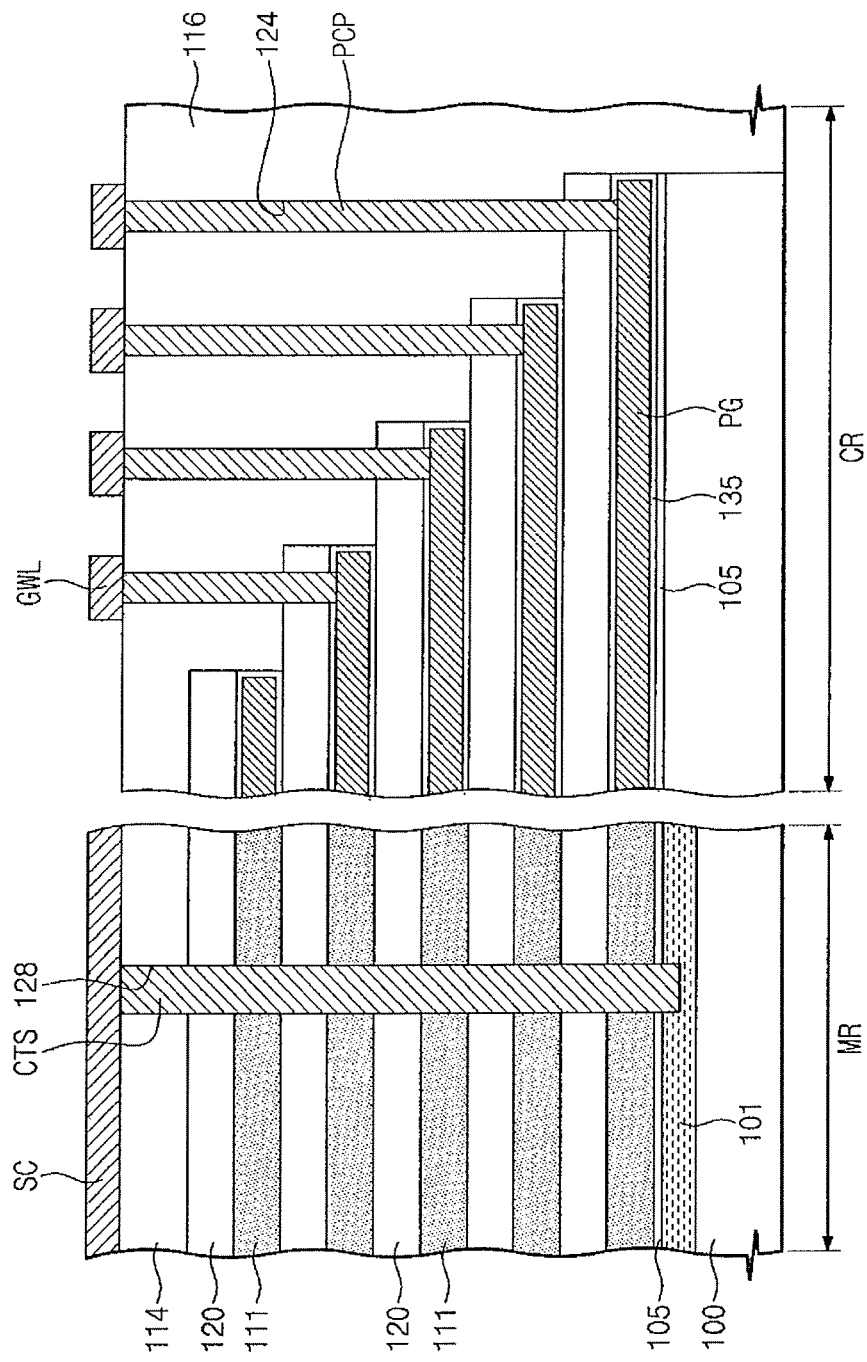
FIG. 45 is a sectional view taken along a line C-C' of FIG. 44.

FIG. 44 is a plan view illustrating a memory cell region MR and a pad contact region CR, according to an exemplary embodiment of the inventive concept, and FIG. 45 is a sectional view taken along line C-C of FIG. 44.

The formation of the contact plugs CTS and pad contact plugs PCP will be described with reference to FIGS. 44 and 45. The memory cell region MR is a region having the cell pillars PL. The pad contact region CR is a region having the pad contact plugs PCP. The pad contact plugs PCP are connected to the horizontal electrodes PG extended from the memory cell region MR to the pad contact region CR. In the pad contact region CR, the horizontal electrodes PG has an edge having a step-wise structure which allows each of the pad contact plugs PCP to be connected to corresponding horizontal electrodes PG. The pad contact plugs PCP are formed in a third interlayered insulating layer 116 and each of them is connected to the corresponding one of the horizontal electrodes PG vertically spaced apart from each other. In the case where the two or more pad contact plugs PCP are connected to one of the horizontal electrodes PG, the pad contact plugs PCP may be connected to each other by a global word line GWL.

A process of forming the contact plug CTS may be at least partially used to form contact plugs in the peripheral circuit region or the pad contact region CR. In an exemplary embodiment, at least one step of the process of forming the contact plug CTS may be applied in forming the pad contact plugs PCP. For example, at least one of pad contact holes 124, in which the pad contact plugs PCP will be formed, may be formed during the formation of the contact holes 128. The contact plugs CTS and the pad contact plugs PCP may be simultaneously formed by forming a conductive layer to fill the contact hole 128 and the pad contact holes 124.

Figure 46:
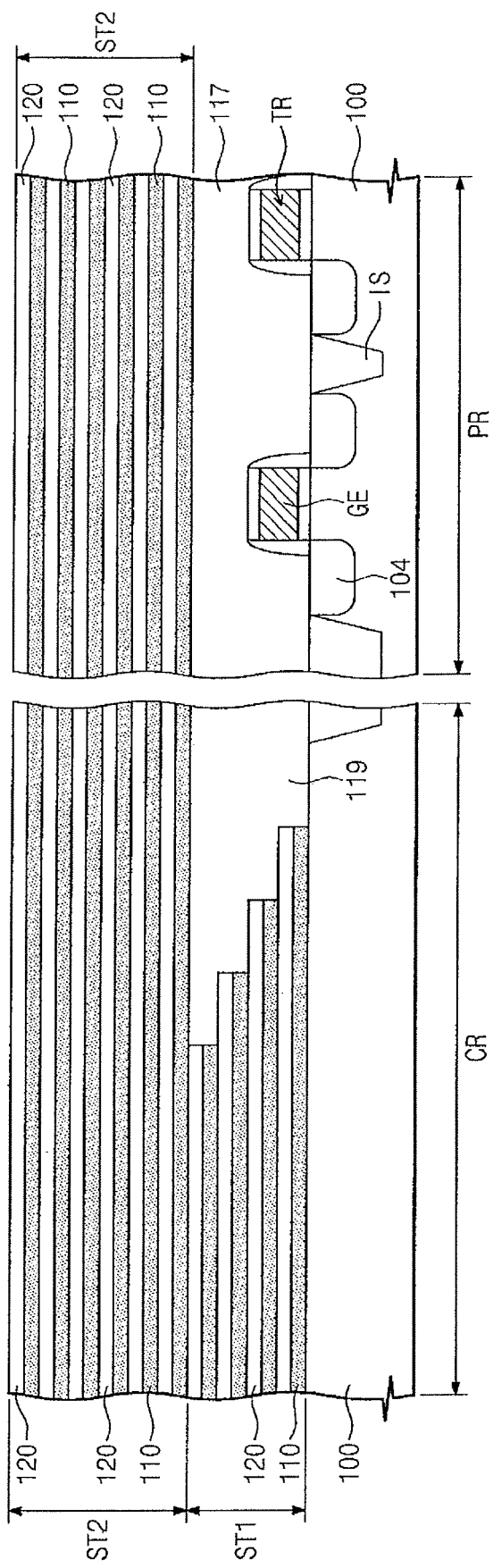
FIGS. 46 and 47 are sectional views illustrating a process of forming a pad contact region and a peripheral circuit region, according to an exemplary embodiment of the inventive concept.
Figure 47:
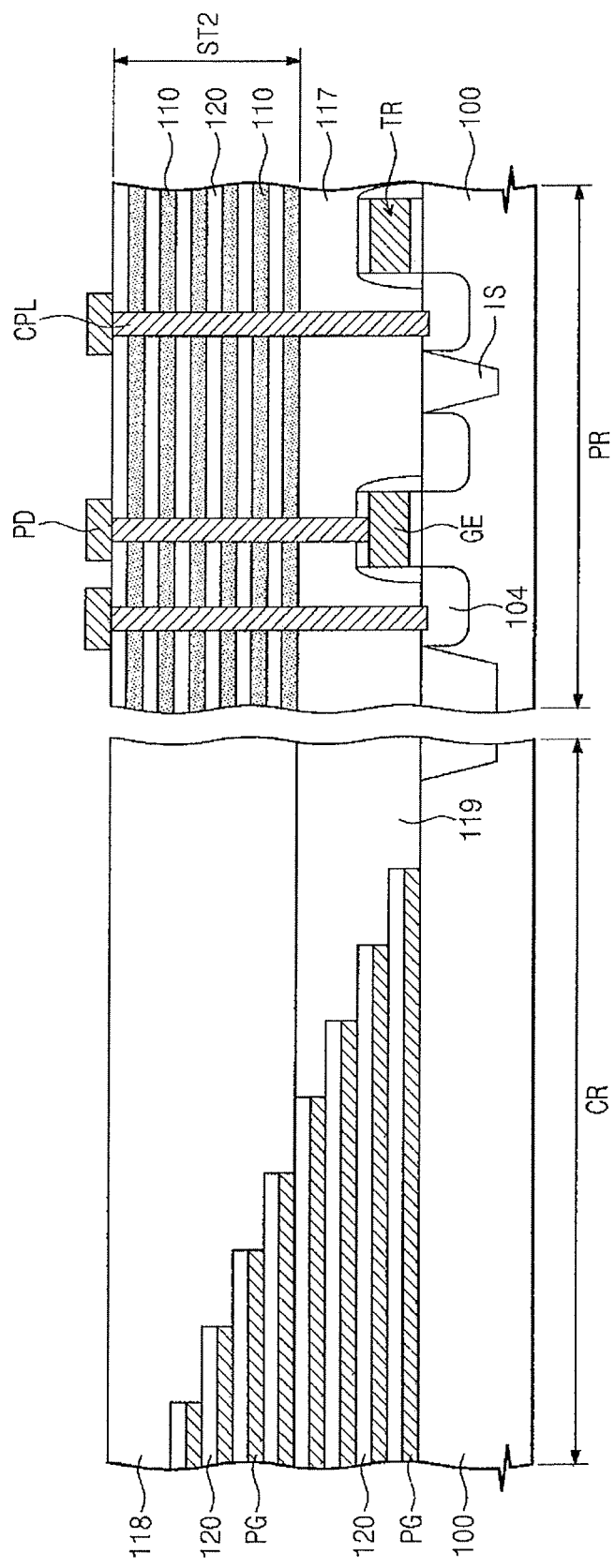

FIGS. 46 and 47 are sectional views illustrating a process of forming the pad contact region CR and the peripheral circuit region PR, according to an exemplary embodiment of the inventive concept.

Referring to FIG. 46, peripheral transistors TR are formed in the peripheral circuit region PR. The peripheral transistors TR are formed on active regions defined by device isolation layers IS. Each of the peripheral transistors TR includes source/drain regions 104 and a gate electrode GE. A fourth interlayered insulating layer 117 is formed on the peripheral circuit region PR to cover the peripheral transistors TR.

A first layer stack ST1 is formed on the pad contact region CR. The first layer stack ST1 includes the first insulating layers 120 and the second insulating layers 110, which are alternately stacked on the substrate 100. In forming the first layer stack ST1, the first insulating layers 120 and the second insulating layers 110 are formed to cover the entire top surface of the substrate 100 and then are partially removed from the peripheral circuit region PR to expose the fourth interlayered insulating layer 117. In removing the first and the second insulating layers 120 and 110, a step-wise structure is formed at the edge of the first layer stack ST1 in the pad contact region CR. Thereafter, a fifth interlayered insulating layer 119 is formed to cover the first layer stack ST1 with the step-wise structure. The fifth interlayered insulating layer 119 may be formed to expose a top surface of the first layer stack ST1.

A second layer stack ST2 is formed on the first layer stack ST1. The second layer stack ST2 covers the pad contact region CR and the peripheral circuit region PR. The second layer stack ST2 includes the first insulating layers 120 and the second insulating layers 110, which are alternately stacked on the substrate 100.

Referring to FIG. 47, the horizontal electrodes PG having the step-wise structure are formed in the pad contact region CR. In forming the horizontal electrodes PG having the step-wise structure, the second layer stack ST2 is patterned to form the step-wise structure, and then, the second insulating layers 110 is replaced with a conductive layer, as described with reference to FIGS. 8 and 9. In an exemplary embodiment, a sixth interlayered insulating layer 118 is formed on the second layer stack ST2 with the step-wise structure.

In exemplary embodiment, in forming the horizontal electrodes PG with the step-wise structure, the second layer stack ST2 formed on the peripheral circuit region PR is protected and remains in the peripheral circuit region PR. Thereafter, peripheral circuit contacts CPL is formed in the peripheral circuit region PR to penetrate the second layer stack ST2. The peripheral circuit contacts CPL is connected to the source/drain regions 104 and/or the gate electrodes GE of the peripheral transistors TR through the first and second insulating layers 120 and 110. The second insulating layers 110 of the second layer stack ST2 are provided between the first insulating layers 120. According to an exemplary embodiment, each of them may be located at substantially the same level as the corresponding one of the horizontal electrodes PG. The peripheral circuit contacts CPL are formed to be in contact with the first and second insulating layers 120 and 110. Peripheral conductive lines PD are formed on the second layer stack ST2 to connect the peripheral circuit contacts CPL with each other.

The inventive concept is not limited to the embodiments described above, but modifications and changes may be made within the scope of the inventive concept defined in the following claims. For example, the features and configurations of the afore-described embodiments may be exchanged or combined with each other within the scope of the inventive concept.

Figure 48:
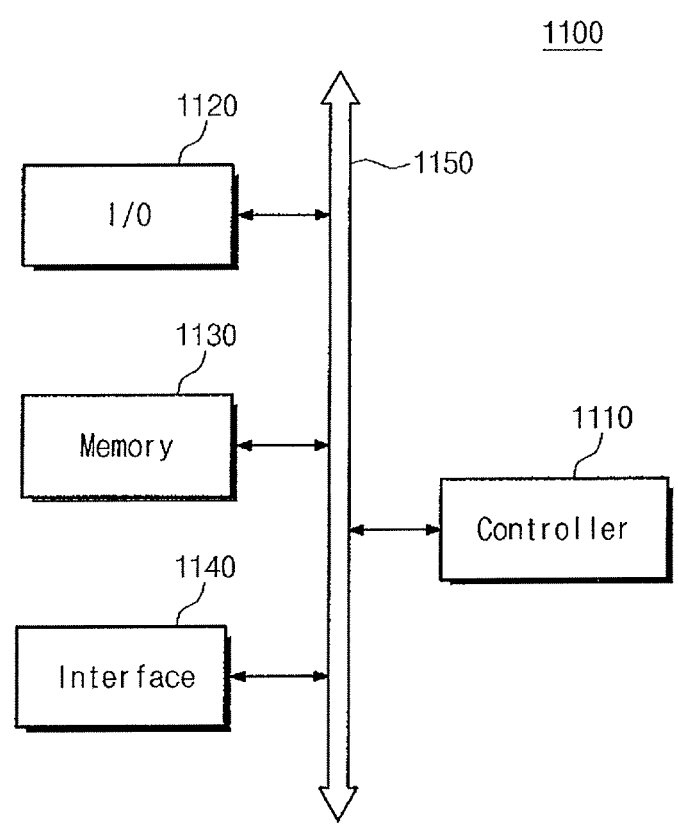
FIG. 48 is a schematic block diagram illustrating an example of memory systems including a semiconductor device according to an exemplary embodiment of the inventive concept.

FIG. 48 is a schematic block diagram illustrating an example of memory systems including a semiconductor device according to an exemplary embodiment of the inventive concept.

Referring to FIG. 48, an electronic system 1100 according to an exemplary embodiment of the inventive concept includes a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The memory device 1130 may include a semiconductor device according to an exemplary embodiment of the inventive concept.

The controller 1110 may include a microprocessor, a digital signal processor, a microcontroller or a logic device. The logic device may have a similar function to any one of the microprocessor, the digital signal processor and the microcontroller. The I/O unit 1120 may include a keypad, a keyboard or a display unit. The memory device 1130 may store data and/or commands. The memory device 1130 may include a semiconductor device according to an exemplary embodiment of the present inventive concept. The memory device 1130 may further include a different type of semiconductor devices from the semiconductor device. The interface unit 1140 may transmit electrical data to a communication network or may receive electrical data from a communication network. The interface unit 1140 may operate in a wireless or cable connection. For example, the interface unit 1140 may include an antenna for wireless communication or a transceiver for cable communication. Although not shown in the drawings, the electronic system 1100 may further include a fast DRAM (Dynamic Random Access Memory) device and/or a fast SRAM (Static Random Access Memory) device that acts as an operating memory device for improving an operation of the controller 1110.

The electronic system 1100 may be applied to a lap-top computer, a personal digital assistant (PDA), a portable computer, a web tablet, a wireless phone, a mobile phone, a digital music player, a memory card or an electronic product. The electronic product may be configured to receive or transmit information data by a wireless communication.

Figure 49:
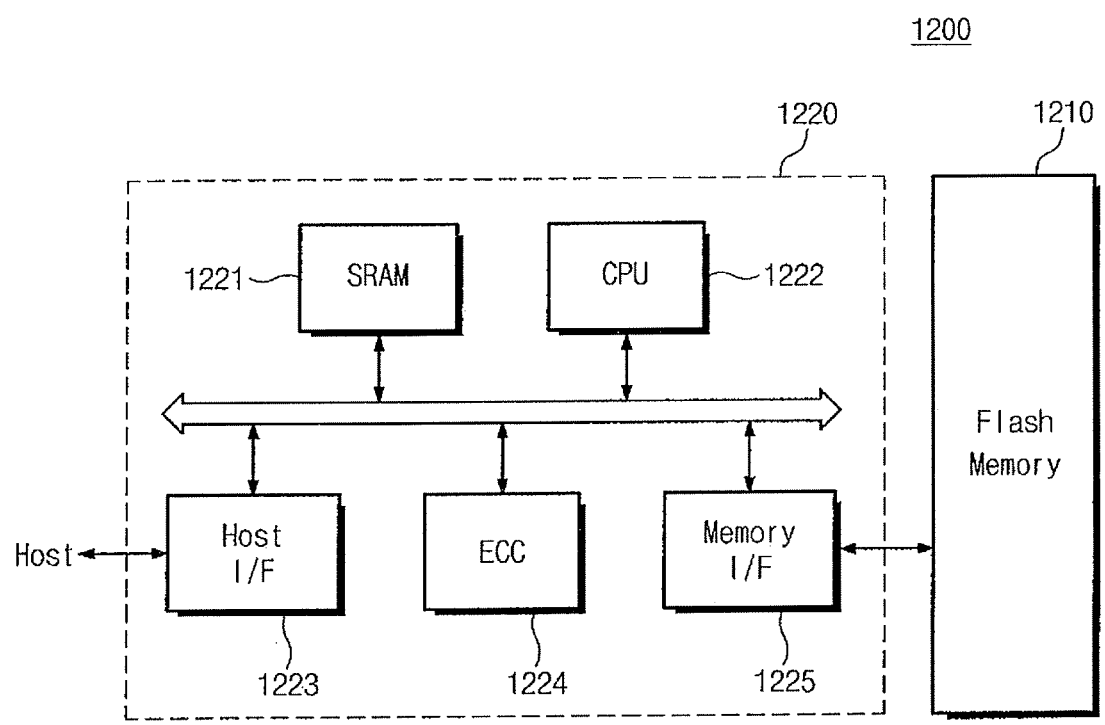
FIG. 49 is a schematic block diagram illustrating an example of memory cards including a semiconductor device according to an exemplary embodiment of the inventive concept.

FIG. 49 is a schematic block diagram illustrating an example of memory cards including a semiconductor device according to an exemplary embodiment of the inventive concept.

Referring to FIG. 49, a memory card 1200 may include a memory device 1210. In an exemplary embodiment, the memory device 1210 may include a semiconductor device according to an exemplary embodiment of the inventive concept. The memory device 1210 may further include a different type of semiconductor devices from the semiconductor device. The memory card 1200 includes a memory controller 1220 that controls data communication between a host and the memory device 1210. The memory device 1210 and/or the controller 1220 may include a semiconductor device according to an exemplary embodiment of the inventive concept.

The memory controller 1220 includes a processing unit 1222 that controls overall operations of the memory card 1200. The memory controller 1220 further includes an SRAM device 1221 used as an operation memory of the processing unit 1222. The memory controller 1220 further includes a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 further includes an error check and correction (ECC) block 1224. The ECC block 1224 may detect and correct errors of data which are read out from the memory device 1210. Although not shown in the drawings, the memory card 1200 may further include a read only memory (ROM) device that stores code data to interface with a host device. The memory card 1200 may be used as a portable data storage card. Alternatively, the memory card 1200 may replace hard disks of computer systems as solid state disks (SSD) of the computer systems.

Figure 50:
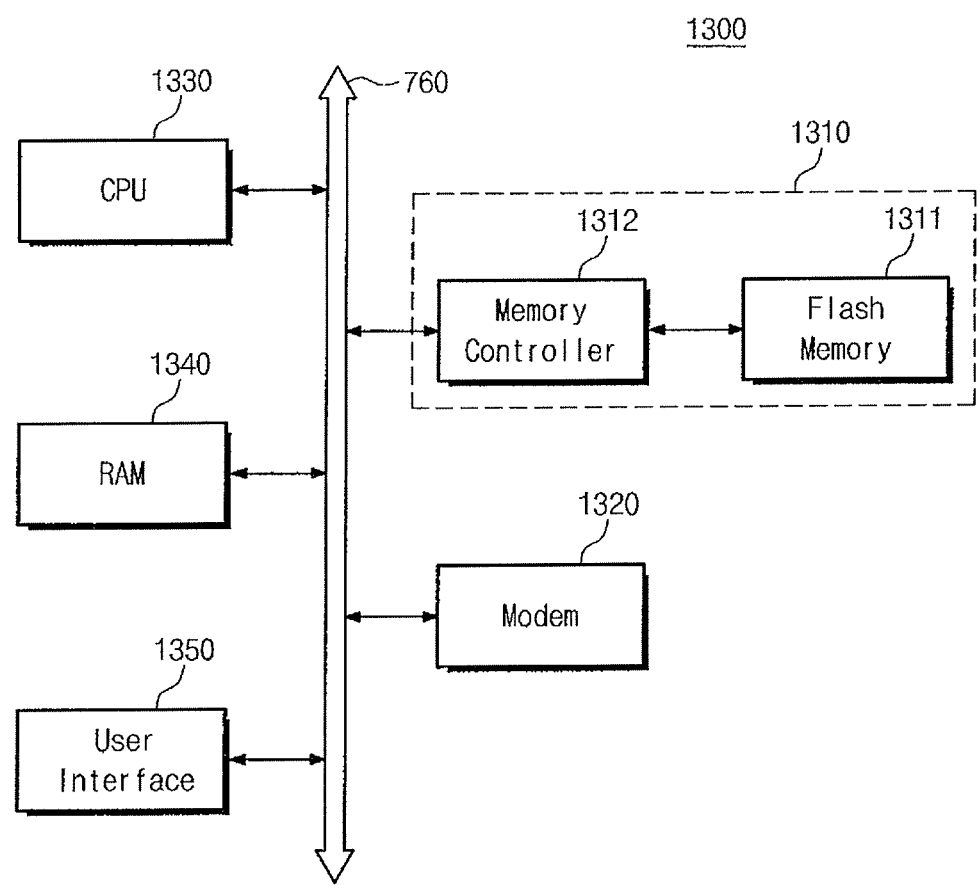
FIG. 50 is a schematic block diagram illustrating an example of information processing systems including a semiconductor device according to an exemplary embodiment of the inventive concept.

FIG. 50 is a schematic block diagram illustrating an example of information processing systems including a semiconductor device according to an exemplary embodiment of the inventive concept.

Referring to FIG. 50, an information processing system 1300 includes a memory system 1310 including a semiconductor device according to an exemplary embodiment of the inventive concept. The information processing system 1300 also includes a modem 1320, a central processing unit (CPU) 1330, a RAM 1340, and a user interface 1350, which may be electrically connected to the memory system 1310 via a system bus 760. The memory system 1310 may be configured to have the same technical features as the memory system of FIG. 48. Data processed by the CPU 1330 and/or input from the outside may be stored in the memory system 1310. Here, the memory system 1310 may be provided as a solid state drive SSD, and thus, the information processing system 1300 may be able to store reliably a large amount of data in the memory system 1310. This increase in reliability enables the memory system 1310 to minimize resources for error correction and realize a high speed data exchange function. Although not shown in the drawing, it will be apparent to those of ordinary skill in the art that the information processing system 1300 may be also configured to include an application chipset, a camera image processor (CIS), and/or an input/output device.

Furthermore, a semiconductor device or memory system according to an exemplary embodiment of the inventive concept may be packaged in various kinds of ways. For example, the semiconductor device or memory system may be employed in a Package on Package (PoP), Ball Grid Array (BGA), Chip Scale Package (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), or Wafer-level Processed Stack Package (WSP).

According to exemplary embodiments of the inventive concept, a contact plug structure may be formed without a process of forming an additional insulating layer, which may be used to electrically separate contact plugs from other conductive elements. Accordingly, a contact hole may be formed to have a reduced size, and thus, it may increase an integration density of a semiconductor device.

While the present inventive concept has been shown and described with reference to exemplary embodiments thereof, it will be apparent to those of ordinary skill in the art that various changes in form and detail may be made therein without departing from the sprit and scope of the inventive concept as defined by the following claims.

What is claimed is:

1. A semiconductor device, comprising:
 a substrate;
 a peripheral transistor on an upper portion of the substrate;
 interlayered insulating layer on the peripheral transistor;

a first structure on the interlayered insulating layer;
at least one peripheral circuit contact penetrating the first structure and the interlayered insulating layer and directly contacting the substrate; and
a peripheral conductive line on the peripheral circuit contact, wherein the first structure includes alternately disposed first insulating layers and second insulating layers including different materials with each other, wherein a top surface of the interlayered insulating layer contacts a bottom surface of the first structure, and wherein the peripheral circuit contact contacts the first insulating layers and the second insulating layers.

2. The device of claim 1, wherein the first insulating layers include a silicon oxide layer and the second insulating layers include a silicon nitride layer or a silicon oxynitride layer.

3. The device of claim 1, wherein numbers of the first insulating layers are four or more and the numbers of the second insulating layers are four or more.

4. The device of claim 1, wherein the first layers have a same thickness with each other and the second layers have a same thickness with each other.

5. The device of claim 1, wherein the peripheral circuit contact contacts sidewalls of the first insulating layers and sidewalls of the second insulating layers.

6. The device of claim 1, wherein the peripheral transistor comprises a gate electrode on the substrate and a source/drain region in an upper portion of the substrate, the peripheral circuit contact is connected with the source/drain region.

7. The device of claim 1, further comprising cell pillars on the substrate.

8. The device of claim 7, further comprising a second structure including alternately disposed horizontal electrodes and third insulating layers,
wherein the cell pillars penetrate the horizontal electrodes.

9. The device of claim 8, wherein at least one the horizontal electrodes are the same level with at least one of the second insulating layers.

10. The device of claim 8, wherein the third insulating layers have a same thickness with the first insulating layers.

11. A semiconductor device, comprising:
a substrate;
a peripheral transistor including a gate electrode on the substrate;
an interlayered insulating layer on the peripheral transistor;
a first structure on the interlayered insulating layer;
at least one peripheral circuit contact penetrating the first structure and the interlayered insulating layer and directly contacting the gate electrode; and
a peripheral conductive line on the peripheral circuit contact, wherein the first structure includes alternately disposed first insulating layers and second insulating layers including different materials with each other, wherein a top surface of the interlayered insulating layer contacts a bottom surface of the first structure, and wherein the peripheral circuit contact contacts the first insulating layers and the second insulating layers.

12. The device of claim 11, wherein numbers of the first insulating layers are four or more and the numbers of the second insulating layers are four or more.

13. The device of claim 11, wherein the first layers have a same thickness with each other and the second layers have a same thickness with each other.

14. The device of claim 11, wherein the peripheral circuit contact contacts sidewalls of the first insulating layers and sidewalls of the second insulating layers.

15. The device of claim 11, further comprising cell pillars on the substrate.

16. The device of claim 15, further comprising a second structure including alternately disposed horizontal electrodes and third insulating layers,
wherein the cell pillars penetrate the horizontal electrodes.

17. The device of claim 16, wherein at least one the horizontal electrodes are the same level with at least one of the second insulating layers.

18. The device of claim 16, wherein the third insulating layers have a same thickness with the first insulating layers.

19. A semiconductor device, comprising:
a substrate;
cell pillars on the substrate;
a peripheral transistor including a gate electrode on the substrate and a source/drain region in an upper portion of the substrate;
an interlayered insulating layer on the peripheral transistor;
a first structure on the interlayered insulating layer;
at least one peripheral circuit contact penetrating the first structure and the interlayered insulating layer and directly contacting the substrate; and
a peripheral conductive line on the peripheral circuit contact, wherein the first structure includes alternately disposed first insulating layers and second insulating layers including different materials with each other, wherein a top surface of the interlayered insulating layer contacts a bottom surface of the first structure, wherein the peripheral circuit contact contacts sidewalls of the first insulating layers and sidewalls of the second insulating layers, and wherein numbers of the first insulating layers are four or more and the numbers of the second insulating layers are four or more.

20. The device of claim 19, wherein the first insulating layers include a silicon oxide layer and the second insulating layers include a silicon nitride layer or a silicon oxynitride layer.

* * * * *